United States Patent
Katami et al.

(10) Patent No.: US 10,626,304 B2
(45) Date of Patent: Apr. 21, 2020

(54) POLARIZING FILM LAMINATE COMPRISING TRANSPARENT PRESSURE-SENSITIVE ADHESIVE LAYER AND PATTERNED TRANSPARENT ELECTROCONDUCTIVE LAYER, LIQUID CRYSTAL PANEL AND ORGANIC EL PANEL

(71) Applicant: NITTO DENKO CORPORATION, Ibaraki-shi, Osaka (JP)

(72) Inventors: Hirofumi Katami, Ibaraki (JP); Atsushi Yasui, Ibaraki (JP)

(73) Assignee: NITTO DENKO CORPORATION, Ibaraki-shi, Osaka (JP)

( * ) Notice: Subject to any disclaimer, the term of this patent is extended or adjusted under 35 U.S.C. 154(b) by 0 days.

(21) Appl. No.: 15/569,202

(22) PCT Filed: Jul. 20, 2016

(86) PCT No.: PCT/JP2016/071302
§ 371 (c)(1),
(2) Date: Oct. 25, 2017

(87) PCT Pub. No.: WO2017/014243
PCT Pub. Date: Jan. 26, 2017

(65) Prior Publication Data
US 2018/0134922 A1 May 17, 2018

(30) Foreign Application Priority Data

Jul. 22, 2015 (JP) .................................. 2015-145288

(51) Int. Cl.
*C09J 7/38* (2018.01)
*H01L 51/52* (2006.01)
(Continued)

(52) U.S. Cl.
CPC ................. *C09J 7/381* (2018.01); *B32B 7/02* (2013.01); *B32B 7/12* (2013.01); *C09J 11/04* (2013.01);
(Continued)

(58) Field of Classification Search
CPC ..... C09J 7/381; C09J 7/38; C09J 11/08; C09J 11/04; C09J 201/00; C09J 2203/318;
(Continued)

(56) References Cited

U.S. PATENT DOCUMENTS 6,842,288 B1 * 1/2005 Liu .......................... G02B 1/111
359/582
9,631,126 B2 4/2017 Lee et al.
(Continued)

FOREIGN PATENT DOCUMENTS

| CN | 1875296 A | 12/2006 |
|---|---|---|
| CN | 102043184 A | 5/2011 |

(Continued)

OTHER PUBLICATIONS

EPO Translation of JP 2003-131032 (Year: 2018).*
(Continued)

*Primary Examiner* — Michael Zhang
(74) *Attorney, Agent, or Firm* — Hauptman Ham, LLP

(57) ABSTRACT

Provided is a polarizing film laminate comprising: an element substrate; a polarizer; a transparent electroconductive layer patterned so as to function as a touch sensor; and a pressure-sensitive adhesive layer, wherein the adhesive layer comprises: a base adhesive zone made of a transparent base pressure-sensitive adhesive material and formed over a given range from the adhesive layer in a thickness direction of the adhesive layer; and a refractive index adjustment zone formed over a given range from the adhesive layer in the thickness direction and comprising the base adhesive mate-
(Continued)

rial and material infiltrated into the base adhesive material and different from the base adhesive material, the refractive index adjustment zone having an average refractive index greater than a refractive index of the base adhesive material, and wherein the base adhesive material zone of the adhesive layer is located on the side of the element substrate.

37 Claims, 12 Drawing Sheets

(51) Int. Cl.
  *G02B 5/30* (2006.01)
  *B32B 7/02* (2019.01)
  *B32B 7/12* (2006.01)
  *C09J 11/04* (2006.01)
(52) U.S. Cl.
  CPC ......... *G02B 5/3033* (2013.01); *G02B 5/3083* (2013.01); *H01L 51/5246* (2013.01)
(58) Field of Classification Search
  CPC ............. C09J 2205/102; C09J 2433/00; H01L 51/5281; H01L 51/5253; H01L 51/5246; B32B 7/12; B32B 7/02; G02B 5/3033; G02B 5/3083; G02B 5/30; G02F 1/1335; C08K 3/22
  See application file for complete search history.

(56) References Cited

U.S. PATENT DOCUMENTS

| | | | |
|---|---|---|---|
| 9,880,419 B2 | 1/2018 | Tsunekawa | |
| 2002/0098352 A1 | 7/2002 | Kishioka | |
| 2009/0050842 A1* | 2/2009 | Shelby | C08B 3/06 252/182.3 |
| 2012/0114919 A1* | 5/2012 | Nakajima | G06F 3/044 428/203 |
| 2013/0154473 A1 | 6/2013 | Kaneko et al. | |
| 2013/0335344 A1* | 12/2013 | Han | C09J 133/066 345/173 |
| 2014/0221571 A1* | 8/2014 | Um | G02B 1/04 525/148 |
| 2014/0255679 A1* | 9/2014 | Goeb | C09J 7/00 428/305.5 |
| 2015/0083464 A1 | 3/2015 | Zilbauer et al. | |
| 2015/0103032 A1* | 4/2015 | Bell | G06F 3/044 345/174 |
| 2015/0301385 A1 | 10/2015 | Tsunekawa | |
| 2016/0130478 A1 | 5/2016 | Nagata et al. | |
| 2016/0200949 A1 | 7/2016 | Lee et al. | |

FOREIGN PATENT DOCUMENTS

| | | |
|---|---|---|
| CN | 104737045 A | 6/2015 |
| JP | 2003-131032 A1 | 5/2003 |
| JP | 2003131032 A * | 5/2003 |
| JP | 2005-105228 A | 4/2005 |
| JP | 2009120726 A * | 6/2009 |
| JP | 4640740 B2 | 3/2011 |
| JP | 5520752 B2 | 6/2014 |
| JP | 5564748 B2 | 8/2014 |
| WO | 2013143614 A1 | 10/2013 |
| WO | 2014/208695 A1 | 12/2014 |
| WO | 2015031246 A1 | 3/2015 |

OTHER PUBLICATIONS

RefractiveIndex.Info, Refractive index of In2O3—SnO2 (Indium tin oxide, ITO)—Konig, https://refractiveindex.info/?shelf=other &book=In2O3—SnO2&page=Konig (Year: 2018).*
EPO Translation of JP-2009120726-A (Year: 2018).*
EPO Translation of JP-2003131032-A (Year: 2018).*
The Written Opinion and Search Report for the corresponding Singapore Patent application No. 11201708484V dated Dec. 4, 2017.
International Search Report dated Oct. 11, 2016 for PCT/JP2016/071302.
Japanese Office Action dated Jan. 30, 2017 corresponding to Japanese Application No. 2015-145288.
Chinese Office Action dated Oct. 12, 2019 for corresponding Chinese Application No. 201680039480.

\* cited by examiner

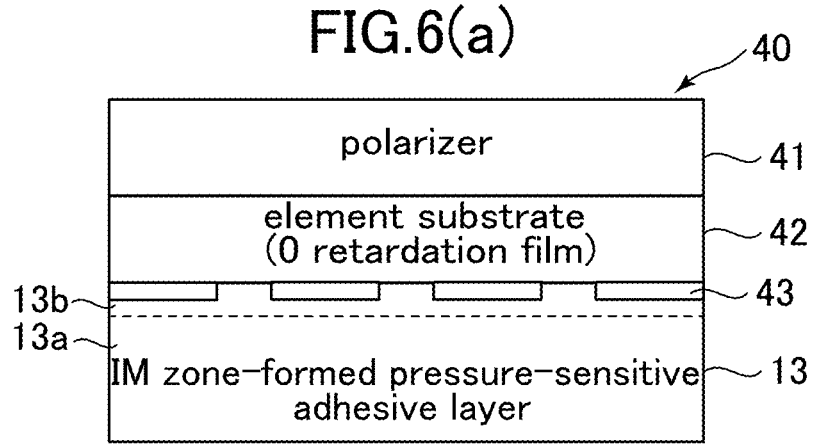
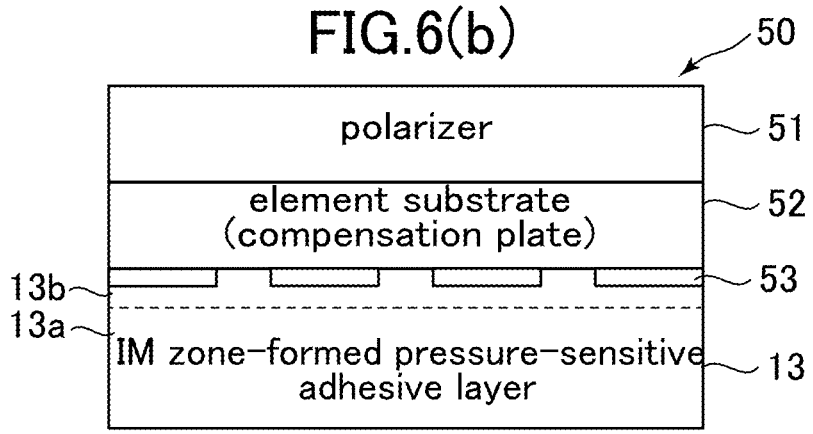
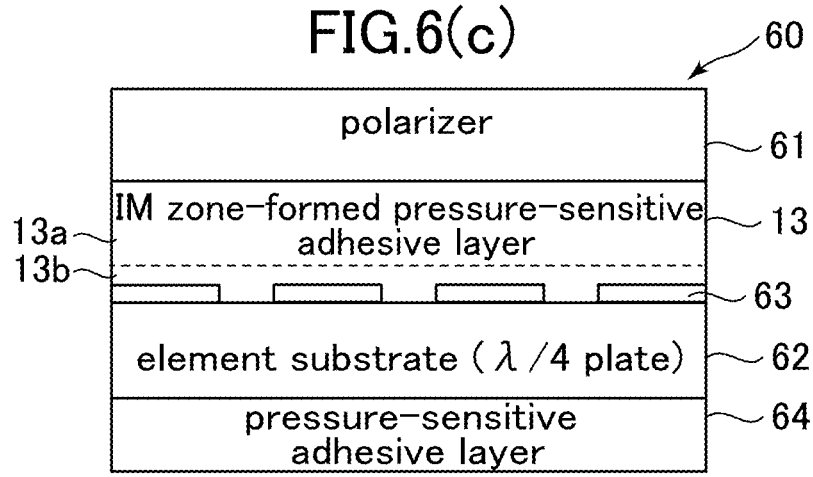

FIG.11(a)

| Acrylic-based film 20μm |
|---|
| polarizer 5 μm |
| IM zone-formed pressure-sensitive adhesive layer (2) 1.48 |
| Refractive index adjustment zone 1.75    ITO    ITO    ITO |
| Element substrate IM layer 1.65 |
| COP element substrate (λ/4 plate) 1.53 |
| Pressure-sensitive adhesive layer A 1.49 |
| Evaluation black acrylic plate |

FIG.11(b)

| Acrylic-based film 20μm |
|---|
| polarizer 5 μm |
| Pressure-sensitive adhesive layer B 1.48    ITO    ITO    ITO |
| Element substrate IM layer 1.65 |
| COP element substrate (λ/4 plate) 1.53 |
| Pressure-sensitive adhesive layer A 1.49 |
| Evaluation black acrylic plate |

FIG.12(a)

| Evaluation ZEONOR |
|---|
| Pressure-sensitive adhesive layer C2 1.48 |
| Acrylic-based film 20μm |
| polarizer 5 μm |
| IM zone-formed pressure-sensitive adhesive layer (3) 1.48 |
| Refractive index adjustment zone 1.72 — ITO   ITO   ITO |
| Element substrate IM layer 1.65 |
| COP element substrate (λ/4 plate) 1.53 |
| Pressure-sensitive adhesive layer A 1.49 |
| Evaluation black acrylic plate |

FIG.12(b)

| Evaluation ZEONOR |
|---|
| Pressure-sensitive adhesive layer C2 1.48 |
| Acrylic-based film 20μm |
| polarizer 5 μm |
| Pressure-sensitive adhesive layer C1 1.48 — ITO   ITO   ITO |
| Element substrate IM layer 1.65 |
| COP element substrate (λ/4 plate) 1.53 |
| Pressure-sensitive adhesive layer A 1.49 |
| Evaluation black acrylic plate |

Embedding resin

Adhesive

Embedding resin

Nanoparticle layer

POLARIZING FILM LAMINATE COMPRISING TRANSPARENT PRESSURE-SENSITIVE ADHESIVE LAYER AND PATTERNED TRANSPARENT ELECTROCONDUCTIVE LAYER, LIQUID CRYSTAL PANEL AND ORGANIC EL PANEL

CROSS REFERENCE TO RELATED APPLICATION

This application claims the priority of Japanese Patent Application No. 2015-145288, filed on Jul. 22, 2015, in the JPO (Japanese Patent Office). Further, this application is the National Phase Application of International Application No. PCT/JP2016/071302, filed on Jul. 20, 2016, which designates the United States and was published in Japan. Both of the priority documents are hereby incorporated by reference in their entireties.

TECHNICAL FIELD

The present invention relates to a polarizing film laminate comprising a transparent pressure-sensitive adhesive layer. In particular, the present invention relates to a polarizing film laminate comprising: a transparent pressure-sensitive adhesive layer usable for bonding a transparent optical element to another optical element; and a patterned transparent electroconductive layer.

BACKGROUND ART

A display device such as a liquid crystal display device or an organic EL display device (OLED) uses a polarizing film together with a retardation film, a transparent cover element such as a cover glass, and various other transparent optical elements, wherein a pressure-sensitive adhesive is required to bond the polarizing film to another optical element. That is, a pressure-sensitive adhesive layer is disposed between the polarizing film and another optical element, and then the two optical elements are pressed against each other and bonded together through the pressure-sensitive adhesive layer to thereby form a polarizing film laminate. Such a polarizing film laminate is used together with a display device such as a liquid crystal display panel or an organic EL display device, and disposed on a viewing side with respect to the display device. In this configuration, there is a problem that, when outside light enters from the transparent optical element which is disposed on the viewing-side, the entered light is reflected at an interface between the pressure-sensitive adhesive layer and another optical element which is disposed on a non-viewing side, and returned to the viewing side. This problem becomes prominent particularly when an entry angle of outside light is relatively large.

On the other hand, in a touch panel-equipped display device which has been increasingly becoming popular in late years, a transparent electroconductive layer such as a patterned ITO (Indium Tin Oxide) layer is formed on a surface of another optical element, i.e., a bonding-target optical element to which a transparent optical element is to be bonded. In this type of display device, the problem "poor pattern invisibility" is pointed out that a pattern of the transparent electroconductive layer becomes visible from the viewing side, under the influence of internal reflection of entered light at an interface between a pressure-sensitive adhesive layer and the transparent electroconductive layer.

In each case, the internal reflection is caused by a difference in refractive index between the pressure-sensitive adhesive layer and each of the bonding-target optical element and the transparent electroconductive layer. JP 4640740 B (Patent Document 1) teaches a technique for addressing this problem. Specifically, the Patent Document 1 discloses a pressure-sensitive adhesive composition capable of reducing total reflection of light at an interface between a transparent optical element and a pressure-sensitive adhesive layer and at the interface between the pressure-sensitive adhesive layer and a bonding-target optical element. The composition disclosed in the Patent Document 1 is allegedly described as having a high refractive index in its dried and/or cured states, wherein it is close to refractive indexes of the transparent optical element and the bonding-target optical element body. The teaching of the Patent Document 1 is that a pressure-sensitive adhesive layer for bonding two optical elements together is entirely formed to have a refractive index close to refractive indexes of the two optical elements.

The technique taught by the Patent Document 1 would be effective in suppressing the interface reflection. On the other hand, there is a problem that the composition itself becomes costly, because this technique is based on the use of a particular monomer component.

JP 5564748 B (Patent Document 2) discloses a refractive index-adjusted pressure-sensitive adhesive which comprises a transparent base pressure-sensitive adhesive material comprised of an acrylic-based resin, and zirconium oxide or titanium oxide particles having an average dispersed particle size of 1 nm to 20 nm, wherein the zirconium oxide or titanium oxide particles are dispersed over the entire thickness of the transparent base pressure-sensitive adhesive material. In this pressure-sensitive adhesive, the zirconium oxide or titanium oxide particles as a high refractive index material are mixed with the transparent base pressure-sensitive adhesive material. Thus, it is considered that a refractive index of a layer of the pressure-sensitive adhesive can be increased in its entirety to thereby suppress the aforementioned interface reflection. However, the technique disclosed in the Patent Document 2 requires the use of a large amount of the high refractive index material. This causes a concern about deterioration in properties required as a pressure-sensitive adhesive, and a problem of an increase in cost. Moreover, the high refractive index material used in the Patent Document 2 is particles of an inorganic material. Thus, there is another problem that the particles are hardly dispersed, causing whitish haze due to light scattering. In this regard, it is conceivable to use particles of an organic material. In this case, however, it becomes difficult to solve a problem of coloration.

With a view to improving the technique disclosed in the Patent Document 2, JP 5520752 B (Patent Document 3) proposes coating, with a polymer, metal oxide particles to be dispersed in a pressure-sensitive adhesive. The teaching of the Patent Document 3 is that, although the pressure-sensitive adhesive layer in the Patent Document 2 has a problem of deterioration in adherence property thereof because the metal oxide particles are exposed to a surface of the pressure-sensitive adhesive layer, this problem can be solved by coating the metal oxide particles with a polymer. The technique proposed by the Patent Document 3 could have a potential to improve the adherence property of the pressure-sensitive adhesive layer to some extent. However, it cannot solve most of the remaining problems pointed out in connection with the Patent Document 2. In particular, the technique described in the Patent Document 3 is based on coating the metal oxide particles with a particular polymer. Thus, the resulting pressure-sensitive adhesive becomes more costly than that in the Patent Document 2.

CITATION LIST

Patent Document

Patent Document 1: JP 4640740 B
Patent Document 2: JP 5564748 B
Patent Document 3: JP 5520752 B

SUMMARY OF INVENTION

Technical Problem

It is a primary object of the present invention to provide a polarizing film laminate which comprises: a pressure-sensitive adhesive layer capable of being produced easily and at low cost, and effectively suppressing internal reflection when used for bonding of the polarizing film laminate; and a patterned transparent electroconductive layer whose pattern is less likely to be visually recognized.

Solution to Technical Problem

In brief, the present invention is directed to forming, over a given range from a surface of a pressure-sensitive adhesive layer in its thickness direction, a refractive index adjustment zone having a refractive index greater than that of a base pressure-sensitive adhesive material of the pressure-sensitive adhesive layer, whereby, when the pressure-sensitive adhesive layer is used for bonding optical elements together, internal reflection in a laminate of these optical elements is suppressed so as to achieve the above object.

According to a first aspect of the present invention, there is provided a polarizing film laminate which comprises: an element substrate; a polarizer formed on one surface of the element substrate; a transparent electroconductive layer formed on the other surface of the element substrate on a side opposite to the polarizer and patterned so as to function as a touch sensor by itself or in cooperation with an additional component; and a pressure-sensitive adhesive layer attached onto the transparent electroconductive layer and the other surface of the element substrate. In the polarizing film laminate, the pressure-sensitive adhesive layer comprises: a base adhesive zone made essentially of a transparent base pressure-sensitive adhesive material and formed over a given range from one principal surface of the pressure-sensitive adhesive layer in a thickness direction of the pressure-sensitive adhesive layer; and a transparent, adherent, refractive index adjustment zone formed over a given range from the other principal surface of the pressure-sensitive adhesive layer in the thickness direction, wherein the refractive index adjustment zone has a refractive index greater than a refractive index of the base pressure-sensitive adhesive material, and wherein the base pressure-sensitive adhesive material zone of the pressure-sensitive adhesive layer is located on the side of the element substrate.

Preferably, the refractive index adjustment zone preferably has a thickness of 20 nm to 600 nm. In one embodiment of the first aspect of the present invention, the refractive index adjustment zone may be formed by dispersing, in a pressure-sensitive adhesive material identical to the base pressure-sensitive adhesive material, particles of a high refractive index material having a refractive index greater than that of the pressure-sensitive adhesive material, to thereby increase an average refractive index of the refractive index adjustment zone. In this embodiment, the refractive index of the high refractive index material particles is preferably in the range of 1.60 to 2.74. Preferably, the high refractive index material has an average primary particle size of 3 to 100 nm as measured by TEM observation. The high refractive index material may be one or more compounds selected from the group consisting of $TiO_2$, $ZrO_2$, $CeO_2$, $Al_2O_3$, $BaTiO_3$, $Nb_2O_5$ and $SnO_2$.

In one embodiment of the first aspect of the present invention, the other principal surface of the refractive index adjustment zone may be formed such that it has a region on which the high refractive index material particles are partially exposed, and a matrix region on which the pressure-sensitive adhesive material of the refractive index adjustment zone is partially exposed. In this case, the region on which the high refractive index material particles are exposed is preferably formed in an area ratio of 30 to 99%. Further, a difference between the refractive index of the high refractive index material particles and the refractive index of the base pressure-sensitive adhesive material is preferably in the range of 0.15 to 1.34.

Preferably, the pressure-sensitive adhesive layer has a total light transmittance of 80% or more. The high refractive index material particles may partially exist in the form of an aggregate arising from aggregation of two or more thereof.

Preferably, the refractive index adjustment zone has a thickness of 20 nm to 600 nm. The refractive index adjustment zone may be formed by dispersing, in a pressure-sensitive adhesive material identical to the base pressure-sensitive adhesive material, particles of a high refractive index material having a refractive index greater than that of the pressure-sensitive adhesive material, whereby an average refractive index of the refractive index adjustment zone is increased by the high refractive index material particles. In this case, the refractive index of the base pressure-sensitive adhesive material is preferably set in the range of 1.40 to 1.55, and the refractive index of the high refractive index material particles is preferably set in the range of 1.60 to 2.74. A bonding surface of the refractive index adjustment zone bonded to an optical element is formed such that it has a region where the high refractive index material particles are in contact with the optical element, and a matrix region where the pressure-sensitive adhesive material of the refractive index adjustment zone is in contact with the optical element. In this case, the region where the high refractive index material particles are in contact with the optical element is preferably formed in an area ratio of 30 to 99%. Further, a difference between the refractive index of the high refractive index material particles and the refractive index of the base pressure-sensitive adhesive material is preferably in the range of 0.15 to 1.34.

The refractive index adjustment zone may be formed by adding, to a pressure-sensitive adhesive material identical to the base pressure-sensitive adhesive material, an organic material having a refractive index greater than that of the pressure-sensitive adhesive material, in the form of particle, polymer or oligomer, to thereby increase an average refractive index of the refractive index adjustment zone. In the case where the pressure-sensitive adhesive layer having this feature is applied to the polarizing film laminate where the transparent electro conductive layer is formed on an optical element, the refractive indexes of the transparent electroconductive layer, the base pressure-sensitive adhesive material and the organic material are, respectively, in the range of 1.75 to 2.14, in the range of 1.40 to 1.55 and in the range of 1.59 to 2.04. Examples of the high refractive index organic material usable herein include, but are not particularly limited to, a resin having an aromatic ring such as a styrene-based resin, and a resin containing a heteroatom such as a sulfur atom or a nitrogen atom (e.g., a polymer containing a thiol or triazine ring). Further, examples of the particles include nanometer-size organic nanoparticles and nanometer-size spherical macromolecules. Preferably, such particles have an average primary particle size of 3 nm to 100 nm as measured by TEM observation.

The pressure-sensitive adhesive layer preferably has a total light transmittance of 80% or more. The high refractive index material particles may partially exist in the form of an aggregate arising from aggregation of two or more thereof. Generally, the refractive index adjustment zone exists with irregular depths in the thickness direction of the pressure-sensitive adhesive layer.

Preferably, the refractive index of the refractive index adjustment zone is less than a refractive index of the transparent electroconductive layer. However, the refractive index of the refractive index adjustment zone may be greater than a refractive index of the element substrate.

Preferably, the transparent electroconductive layer is made of indium tin oxide, wherein the refractive index of the base pressure-sensitive adhesive material is in the range of 1.40 to 1.55, and the refractive index of the refractive index adjustment zone is in the range of 1.50 to 1.80. More preferably, the element substrate is a zero retardation film.

According to a second aspect of the present invention, there is provided a liquid crystal panel which comprises: the polarizing film laminate according to the first aspect of the present invention; a protective film located on the side of the polarizer of the polarizing film laminate; and a liquid crystal cell located on the side of the pressure-sensitive adhesive layer of the polarizing film laminate.

In the first aspect of the present invention, the element substrate may be a retardation film. In this case, the retardation film preferably has a glass transition temperature of 120 degrees or more.

According to a third aspect of the present invention, there is provided a liquid crystal panel which comprises: the above polarizing film laminate in which the element substrate is a retardation film; a protective film located on the side of the polarizer of the polarizing film laminate; and a liquid crystal cell located on the side of the pressure-sensitive adhesive layer of the polarizing film laminate.

According to a fourth aspect of the present invention, there is provided a polarizing film laminate which comprises: an element substrate; a transparent electroconductive layer formed on one surface of the element substrate and patterned so as to function as a touch sensor by itself or in cooperation with an additional component; a first pressure-sensitive adhesive layer attached onto the one surface of the element substrate and the transparent electroconductive layer; a polarizer located on one surface of the first pressure-sensitive adhesive layer on a side opposite to the element substrate; and a second pressure-sensitive adhesive layer attached to the other surface of the element substrate on a side opposite to the transparent electroconductive layer. In this polarizing film laminate, the first pressure-sensitive adhesive layer comprises: a base adhesive zone made essentially of a transparent base pressure-sensitive adhesive material and formed over a given range from one principal surface of the first pressure-sensitive adhesive layer in a thickness direction of the first pressure-sensitive adhesive layer; and a transparent, adherent, refractive index adjustment zone formed over a given range from the other principal surface of the first pressure-sensitive adhesive layer in the thickness direction, wherein the refractive index adjustment zone has a refractive index greater than a refractive index of the base pressure-sensitive adhesive material, and wherein the base pressure-sensitive adhesive material zone of the first pressure-sensitive adhesive layer is located on the side of the polarizer. In the fourth aspect of the present invention, any of the pressure-sensitive adhesive layers having the aforementioned features in the polarizing film laminate according to the first aspect of the present invention may be used as the first pressure-sensitive adhesive layer. In the first aspect of the present invention, the element substrate is preferably a ¼-wavelength retardation film.

According to a fifth aspect of the present invention, there is provided an organic EL panel which comprises: the polarizing film laminate according to the first aspect of the present invention; a surface protective film located on the side of the polarizer of the polarizing film laminate; and a liquid crystal cell located on the side of the second pressure-sensitive adhesive layer of the polarizing film laminate. This organic EL panel may further comprise: a ¼-wavelength retardation film attached to one surface of the polarizer on a side opposite to the first pressure-sensitive adhesive layer; a low-refractive index layer attached to one surface of the ¼-wavelength retardation film attached to the polarizer, on a side opposite to the polarizer; and a third pressure-sensitive adhesive layer attached to one surface of the low-refractive index layer on a side opposite to the ¼-wavelength retardation film attached to the polarizer, wherein the surface protective layer is attached to one surface of the third pressure-sensitive adhesive layer on a side opposite to the low-refractive index layer.

For example, when a pressure-sensitive adhesive sheet comprising the pressure-sensitive adhesive layer for use in the present invention is used to bond a polarizing film to an optical element having a patterned transparent electroconductive layer, so as to form a touch sensor, the pressure-sensitive adhesive layer is peeled off from a support (backing), and positionally adjusted such that one surface of the pressure-sensitive adhesive layer defined by the transparent, adherent, refractive index adjustment zone faces the patterned transparent electroconductive layer and the optical element, and the other surface of the pressure-sensitive adhesive layer faces the polarizing film. Then, the refractive index adjustment zone is boded to the patterned transparent electroconductive layer and the optical element, and the other surface of the pressure-sensitive adhesive layer is bonded to the polarizing film, wherein the refractive index adjustment zone comes into contact with both of the transparent electroconductive layer and the optical element so as to fill up a stepped space between the transparent electroconductive layer and the optical element, whereby reflected light resulting from reflection of external light entering through the polarizing film, at an interface between the base pressure-sensitive adhesive layer and the refractive index adjustment zone, and reflected light resulting from reflection of the external light at an interface between the refractive index adjustment zone and the transparent electroconductive layer, are at least partially cancelled out by means of optical interference.

Thus, when the pressure-sensitive adhesive sheet according to the present invention is used to suppress such internal reflection, it is possible to at least partially cancel out reflected light resulting from reflection of entered external light at an interface between a zone made essentially of the base pressure-sensitive adhesive material and the refractive index adjustment zone in the pressure-sensitive adhesive layer, and reflected light resulting from reflection of the external light at an interface between the refractive index adjustment zone and an optical element, by means of optical interference.

Effect of Invention

In the configuration where the patterned transparent electroconductive layer is formed on an optical element, the present invention makes it possible to adjust the refractive index of the refractive index adjustment zone in the pressure-sensitive adhesive layer, with respect to the refractive indexes of the transparent electroconductive layer and the optical element, to thereby suppress the interface reflection. In addition, it becomes possible to significantly reduce reflected light which would otherwise be returned toward a viewing-side optical element, by the canceling-out effect based on a phase difference between respective ones of reflected light at the transparent electroconductive layer, reflected light at a surface of a second optical element and reflected light arising inside the pressure-sensitive adhesive layer.

BRIEF DESCRIPTION OF DRAWINGS

FIG. 6(a) is a schematic diagram depicting a configuration of a polarizing film laminate 40 according to one embodiment of the present invention.

FIG. 6(b) is a schematic diagram depicting a configuration of a polarizing film laminate 50 according to one embodiment of the present invention.

FIG. 6(c) is a schematic diagram depicting a configuration of a polarizing film laminate 60 according to one embodiment of the present invention.

FIG. 11(a) is schematic diagram depicting a configuration of a polarizing film laminate in Inventive Example 3.

FIG. 11(b) is schematic diagram depicting a configuration of a polarizing film laminate in Comparative Example 3.

FIG. 12(a) is schematic diagram depicting a configuration of a polarizing film laminate in Inventive Example 4.

FIG. 12(b) is schematic diagram depicting a configuration of a polarizing film laminate in Comparative Example 4.

DESCRIPTION OF EMBODIMENTS

Although the present invention will now be described based on embodiments thereof in connection with the drawings, it should be understood that the present invention is not limited to the embodiments, but various changes and modifications may be made therein without departing from the spirit and scope thereof as set forth in appended claims. Further, in each Example, part(s) and % mean weight part(s) (part(s) by weight) and weight % (% by weight), respectively, and, unless otherwise specified, room temperature storage conditions consist of 23° C. and 65% R.H.

Figure 1A:
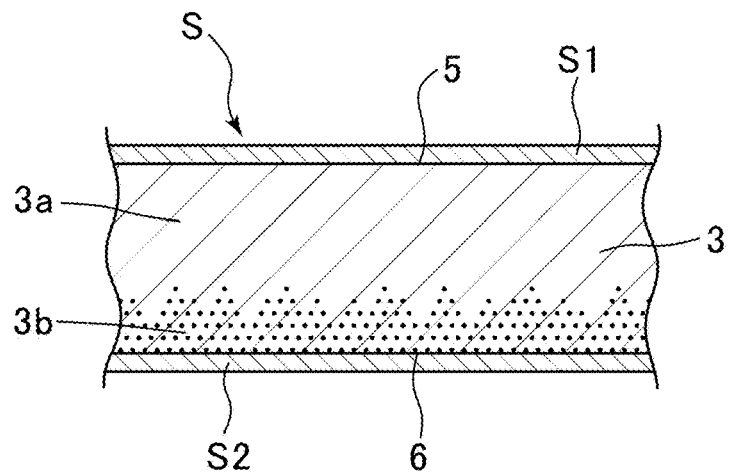
FIG. 1(a) is a sectional view depicting a pressure-sensitive adhesive sheet according to one embodiment of the present invention.
Figure 1B:
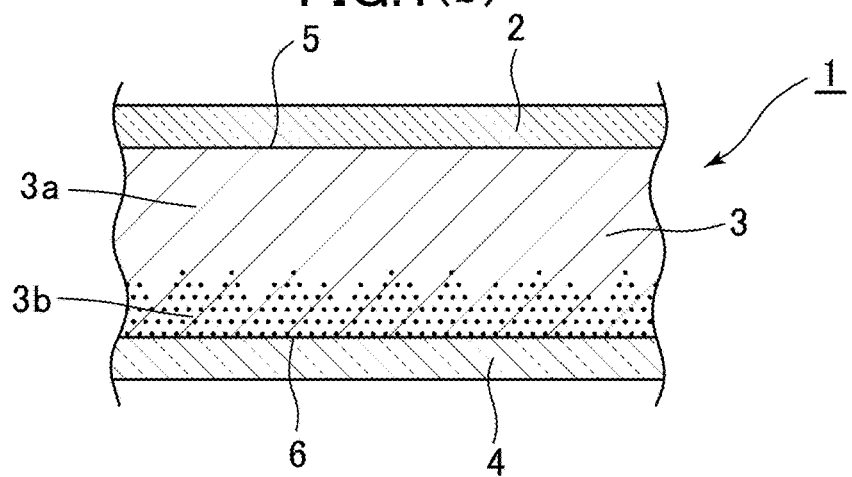
FIG. 1(b) is a sectional view depicting a simplest example of an optical element laminate according to one embodiment of the present invention, which is produced using the pressure-sensitive adhesive sheet in FIG. 1(a).

FIG. 1(a) is a sectional view depicting a pressure-sensitive adhesive sheet according to one embodiment of the present invention, and FIG. 1(b) is a sectional view depicting a simplest example of an optical element laminate 1 according to one embodiment of the present invention, which is produced using the pressure-sensitive adhesive sheet in FIG. 1(a). Referring to FIG. 1(a), a pressure-sensitive adhesive sheet S usable for the present invention comprises: an optically transparent pressure-sensitive adhesive layer 3; a first support S1 composed of a separator laminated to one principal surface of the pressure-sensitive adhesive layer 3; and a second support S2 composed of a separator laminated to the other principal surface of the pressure-sensitive adhesive layer 3. Referring to FIG. 1(b), the optical element laminate 1 comprises a polarizing film 2, and a second optical element 4 bonded to the polarizing film 2 through an optically transparent pressure-sensitive adhesive layer 3. The optical element laminate 1 is obtained by peeling off the supports S1, S2 from the pressure-sensitive adhesive sheet S depicted in FIG. 1(a), and laminating one surface of the pressure-sensitive adhesive layer 3 from which the support S1 has been peeled off and the other surface of the pressure-sensitive adhesive layer 3 from which the support S2 has been peeled off, respectively, to a polarizing film and a desired second optical element. The second optical element 4 may be composed of an optical film for use in an optical display device, such as a retardation film, or a transparent cover element for use in an optical display device, such as a viewing-side cover glass. The polarizing film 2 and the second optical element 4 are bonded, respectively, to a first principal surface 5 and a second principal surface 6 of the pressure-sensitive adhesive layer 3.

The transparent pressure-sensitive adhesive layer 3 comprises a base adhesive zone 3a made essentially of a base pressure-sensitive adhesive material, and a refractive index adjustment zone 3b having a refractive index greater than that of the base adhesive zone 3a. Preferably, the refractive index of the base pressure-sensitive adhesive material of the base adhesive zone 3a is close to the refractive index of the polarizing film 2. For example, a difference between the refractive index of the polarizing film 2 and the refractive index of the base pressure-sensitive adhesive material falls preferably within 0.3, more preferably, within 0.1.

The base pressure-sensitive adhesive material is not particularly limited, as long as it is a transparent adherent material usable in optical applications. For example, it is possible to use one or more appropriately selected from the group consisting of an acrylic-based pressure-sensitive adhesive, a rubber-based pressure-sensitive adhesive, a silicone-based pressure-sensitive adhesive, a polyester-based pressure-sensitive adhesive, a urethane-based pressure-sensitive adhesive, an epoxy-based pressure-sensitive adhesive, and a polyether-based pressure-sensitive adhesive. From the viewpoint of transparency, processability, durability, etc., it is preferable to use an acrylic-based pressure-sensitive adhesive. As the base pressure-sensitive adhesive material, the above pressure-sensitive adhesives may be used independently or in the form of a combination of two or more of them. An acrylic-based polymer to be used as a base polymer of an acrylic-based pressure-sensitive adhesive is preferably, but not particularly limited to, a homopolymer or copolymer of monomers comprising a primary component consisting of (meth)acrylic acid alkyl ester. It should be noted that the term "(meth)acrylic" is used herein to mean either one or both of "acrylic" and "methacrylic", and this definition is also applied to the following description. In this specification, the term "acrylic-based polymer" is used to mean that it may include the above (meth)acrylic acid alkyl ester, and any other monomer copolymerizable with the (meth)acrylic acid alkyl ester. Generally, the refractive index of the base pressure-sensitive adhesive material is in the range of 1.40 to 1.55.

Although a thickness of the pressure-sensitive adhesive layer 3 is not particularly limited, it is set, typically, in the range of 5 μm to 500 μm, preferably, in the range of 5 μm to 400 μm, more preferably, in the range of 5 μm to 300 μm. In the pressure-sensitive adhesive layer 3, a thickness of the refractive index adjustment zone 3b is set, preferably, in the range of 20 nm to 600 nm, more preferably, in the range of 20 nm to 300 nm, furthermore preferably, in the range of 20 nm to 200 nm. A boundary between the refractive index adjustment zone 3b and the base adhesive zone 3a is formed as an irregular undulating curve. In this specification, the thickness of the refractive index adjustment zone 3b is determined by averaging a plurality of measurement values of a depth of the undulation. A thickness of the base adhesive zone 3a is derived by subtracting the thickness of the refractive index adjustment zone 3b from the thickness of the pressure-sensitive adhesive layer 3. As measured according to JIS K7361, a total light transmittance of the entire pressure-sensitive adhesive layer 3 is 80% or more, preferably, 90% or more. The higher total light transmittance of the pressure-sensitive adhesive layer 3 provides the better results. Further, a haze value of the pressure-sensitive adhesive layer 3 is preferably 1.5% or less, more preferably, 1% or less.

Various additives may be added to the pressure-sensitive adhesive layer 3 for use in the present invention. For example, it is preferable to add any of various silane coupling agents to improve adhesion under high-temperature and high-humidity conditions. The silane coupling agent also has an effect of imparting a cohesion force which acts to improve durability of a pressure-sensitive adhesive. It is also preferable to add a cross-linking agent to the pressure-sensitive adhesive layer for use in the present invention, because the cross-linking agent can impart a cohesion force associated with durability of a pressure-sensitive adhesive. Further, it is possible to use, as needed basis, viscosity modifier, release regulator, tackifier, plasticizer, softener, filler composed of an inorganic powder, colorant (pigment, dye, etc.), pH adjuster (acid or base), rust inhibitor, antioxidant and ultraviolet absorber.

The pressure-sensitive adhesive layer may be formed by, but not particularly limited to, a method comprising: applying the base pressure-sensitive adhesive material on any of various element substrates (a separator film, a transparent resin film, etc.); drying the applied base pressure-sensitive adhesive material by a dryer such as a thermal oven, to vaporize a solvent or the like and thereby form a matrix material-based pressure-sensitive adhesive layer; and transferring the matrix material-based pressure-sensitive adhesive layer onto a polarizing film or a substrate of a liquid crystal cell, or a method comprising applying the base pressure-sensitive adhesive material directly onto the polarizing film or liquid crystal cell to form a matrix material-based pressure-sensitive adhesive layer thereon.

Then, the refractive index adjustment zone 3b can be formed, for example, by applying a solution of a resin material having a refractive index greater than that of the base pressure-sensitive adhesive material onto one surface of the matrix material-based pressure-sensitive adhesive layer formed on the element substrate, and then subjecting the resulting pressure-sensitive adhesive layer to drying. Examples of the resin material usable for this purpose include a pressure-sensitive adhesive composition described in the Patent Document 1. Alternatively, it is possible to employ a technique of: dispersing, in the form of a solid, an organic material having a refractive index greater than that of the base pressure-sensitive adhesive material, such as styrene oligomer, in a dispersion medium to prepare a dispersion liquid; applying the dispersion liquid to a surface of a layer of the base pressure-sensitive adhesive material (matrix material-based pressure-sensitive adhesive layer); and subjecting the resulting pressure-sensitive adhesive layer to drying. However, in the present invention, it is preferable to employ a technique of causing particles of a high refractive index material to infiltrate into the matrix material-based pressure-sensitive adhesive layer made of the base pressure-sensitive adhesive material, from the one surface thereof, whereby the high refractive index material particles are dispersed in a region of the matrix material-based pressure-sensitive adhesive layer adjacent to the one surface, as described later in connection with FIG. 2.

Figure 2:
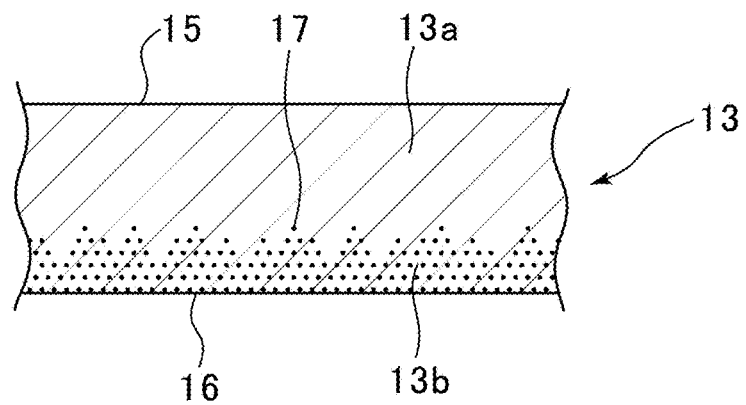
FIG. 2 is a sectional view depicting one example of a pressure-sensitive adhesive layer for use in a pressure-sensitive adhesive sheet of the present invention.

With reference to FIG. 2, a configuration of a pressure-sensitive adhesive layer 13 as one example of a pressure-sensitive adhesive layer for use in the present invention will be described in detail below.

As with the pressure-sensitive adhesive layer 3 in the pressure-sensitive adhesive sheet depicted in FIG. 1, the pressure-sensitive adhesive layer 13 depicted in FIG. 2 has a first principal surface 15 and a second principal surface 16, and comprises a base adhesive zone 13a made essentially of a base pressure-sensitive adhesive material, and a refractive index adjustment zone 13b having a refractive index greater than that of the base adhesive zone 13a. In this example, the refractive index adjustment zone 13b is formed such that it contains particles 17 of a high refractive index material which are caused to infiltrate into a layer of the base pressure-sensitive adhesive material (matrix material-based pressure-sensitive adhesive layer) from the second principal surface 16, and dispersed in the matrix material-based pressure-sensitive adhesive layer, over a given depth in a thickness direction of the matrix material-based pressure-sensitive adhesive layer, to thereby have a refractive index greater than that of the base adhesive zone 13a.

Preferably, a refractive index of the high refractive index material particles 17 in the refractive index adjustment zone 13b is in the range of 1.6 to 2.7. Further, for example, a difference between the refractive index of the high refractive index material particles and the refractive index of the base pressure-sensitive adhesive material is preferably in the range of 0.2 to 1.3. In the case where the refractive index adjustment zone is formed by impregnating a part of the matrix material-based pressure-sensitive adhesive layer with an organic material having a refractive index greater than that of the base pressure-sensitive adhesive material, a difference between the refractive index of the organic material and the refractive index of the base pressure-sensitive adhesive material is preferably set in the range of 0.1 to 0.6. From a viewpoint of compatibility with the base pressure-sensitive adhesive material (risks of bleed-out under low temperatures and segregation under high temperatures), and from a viewpoint of durability under high temperature or high temperature and high humidity, it is preferable to use an inorganic high refractive index material which generally has heat resistance greater than that of an organic material. Examples of a high refractive index material usable in this example where high refractive index material particles are used in the refractive index adjustment zone include $TiO_2$, $ZrO_2$, $CeO_2$, $Al_2O_3$, $BaTiO_2$, $Nb_2O_5$ and $SnO_2$, and one or more compounds selected from them can be used to form the high refractive index material particles 17. The high refractive index material particles 17 may be set to have an average primary particle size of 3 nm to 100 nm, and distributed in the refractive index adjustment zone 13b in an individually dispersed state or in a partially aggregated state. As described in connection with FIG. 1, a boundary between the refractive index adjustment zone 13b and the base adhesive zone 13a is formed as an irregular undulating curve. In a thickness measurement for the refractive index adjustment zone 13b, a depth at each of a plurality of measurement positions in a region where 90% of the high refractive index material particles 17 exist is determined as a thickness measurement value, and the measurement values at the plurality of measurement positions are averaged to obtain a thickness of the refractive index adjustment zone 13b.

Figure 3:
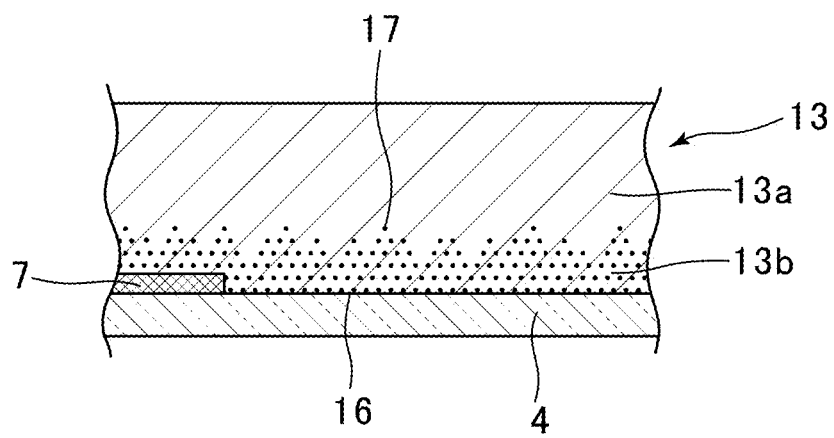
FIG. 3 is a sectional view depicting one example where the pressure-sensitive adhesive layer 13 depicted in FIG. 2 is applied to an optical element formed with a patterned transparent electroconductive layer.

FIG. 3 is a sectional view depicting one example where the pressure-sensitive adhesive layer 13 depicted in FIG. 2 is applied to a configuration in which a patterned transparent electroconductive layer 7 such as a patterned ITO film is formed on a surface of a second optical element 4 on the side of the pressure-sensitive adhesive layer 13 so as to form a touch panel sensor. In this case, examples of the second optical element 4 may include a glass substrate of a display panel, for example, in a liquid crystal display device or an organic EL display device.

A material forming the transparent electroconductive layer 7 is not particularly limited, and it is possible to use a metal oxide of at least one metal selected from the group consisting of indium, tin, zinc, gallium, antimony, titanium, silicon, zirconium, magnesium, aluminum, gold, silver, copper, palladium and tungsten. The metal oxide may further contain a metal atom presented in the above group as necessary. For example, it is preferable to use indium oxide (ITO) containing tin oxide, tin oxide containing antimony, or the like. Among them, ITO is particularly preferable. More preferably, ITO contains 80 to 99 weight % of indium oxide and 1 to 20 weight % of tin oxide. The ITO may be crystalline ITO or may be amorphous ITO. For example, the crystalline ITO can be obtained by subjecting ITO to sputtering under high temperatures to form amorphous ITO, and further heating the amorphous ITO so as to cause crystallization. For the transparent electroconductive layer, any of various shapes such as a comb-like shape, a stripe shape and a diamond shape may be employed depending on the intended use. Although a thickness of the transparent electroconductive layer 7 is not particularly limited, it is preferably set to 7 nm or more, more preferably, 12 to 200 nm, furthermore preferably, 12 to 100 nm, particularly preferably, 18 to 70 nm. If the thickness of the transparent electroconductive layer 7 is less than 7 nm, the transparent electroconductive layer 7 is not evenly attached in plane, so that it is likely that a resistance value in plane becomes unstable, or a desired resistance value fails to be obtained. On the other hand, if the thickness of the transparent electroconductive layer 7 is greater than 200 nm, the transparent electroconductive layer 7 tends to undergo deterioration in productivity, increase in cost, and deterioration in optical properties. A method for forming the transparent electroconductive layer 7 is not limited to the aforementioned sputtering process, but any of various processes may be employed. Specific examples thereof may include a vacuum vapor deposition process and an ion plating process. Among them, an appropriate process may be selectively employed according to a required thickness.

As a material for the transparent electroconductive layer 7, it is possible to employ a metal nanowire and a metal mesh. The metal nanowire means an electroconductive substance which is made of a metal and formed in a needle-like or thread-like shape having a nanometer size in diameter. Each metal nanowire has a nanometer size and is thereby invisible. On the other hand, a transparent electroconductive layer can be formed by arranging a plurality of metal nanowires to keep down an electrical resistance value. The metal nanowire may be linear or may be curved. When a transparent electroconductive layer composed of metal nanowires is used, the metal nanowires are formed into a mesh shape. Thus, even in the case where an amount of metal nanowires is relatively small, it is possible to form a good electrical conduction path and obtain a transparent electroconductive film having a relatively small electrical resistance. Further, the metal nanowires are formed into a mesh shape, so that openings are formed between mesh intervals. This makes it possible to obtain a transparent electroconductive film having a high light transmittance. Any appropriate metal may be used as a metal forming the metal nanowire, as long as the metal has high electroconductivity. Examples of the metal forming the metal nanowire include silver, gold, copper, and nickel. Further, it is possible to use a material obtained by subjecting each of the metals to plating (such as gold plating). Among them, from a viewpoint of electroconductivity, silver, copper, or gold is preferable and silver is more preferable.

The transparent electroconductive layer containing a metal mesh is obtained by forming a thin metal wire into a lattice pattern, on the aforementioned element substrate laminate. The metal mesh may be made of the same metal as that forming the aforementioned metal nanowire. The transparent electroconductive layer containing the metal mesh can be formed by any appropriate method. For example, the transparent electroconductive layer can be obtained by applying a photosensitive composition (composition for forming a transparent electroconductive layer) containing a silver salt onto the element substrate laminate, and then subjecting the resulting element substrate laminate to light exposure and developing to form the thin metal wire into a given pattern.

A material for an element substrate layer to be disposed on the viewing side with respect to a polarizer is not particularly limited as long as it is transparent in a visual light range, and it is possible to use glass, and any of various plastic films having transparency. When the element substrate layer is used for forming the transparent electroconductive layer or as an element substrate for a flexible display or the like, a flexible film such as a plastic film is preferably used.

Examples of a material for the plastic film include a polyester-based resin, an acetate-based resin, a polyether sulfone-based resin, a polycarbonate-based resin, a polyamide-based resin, a polyimide-based resin, a poly(cyclo)olefin-based resin, a (meth)acrylic-based resin, a polyvinyl chloride-based resin, a polystyrene-based resin, a polyvinyl alcohol-based resin, a polyarylate-based resin and a polyphenylene sulfide-based resin. Among them, preferable examples include a polyester-based resin (PET), an acetate-based resin (TAC), (meth)acrylic-based resin (acrylic), a polycarbonate-based resin (PC), and a poly(cyclo)olefin-based resin (COP).

A transparent protective film laminated outside a polarizer as viewed from an image display device may have a functional layer. Examples of the functional layer include a hard coat layer, an antireflection layer, an antifouling layer, an antistatic layer, and a treated layer for diffusion or anti-glare. The functional layer may be formed by arbitrarily combining two or more of them. Further, an ultraviolet absorption function may be imparted to an element substrate of the protective film.

In the polarizing film for use in the present invention, an element substrate layer is disposed on an inner side (on the side of a display panel) of the polarizer. As the inner element substrate layer, it is possible to use a zero retardation film, or a retardation film such as a $\lambda/2$ retardation film or a $\lambda/4$ retardation film. When a zero retardation film is used as the element substrate layer, the element substrate layer preferably has a low amount of birefringence (retardation) and high optical isotropy. Large birefringence can lead to a negative effect such as a coloration phenomenon, i.e., color shift, caused by light leaking from an oblique direction during black display. For this reason, a material free from optical birefringence is preferable. Specifically, the element substrate layer is preferably formed of polycarbonate-based resin or cycloolefin-based resin, having optical isotropy.

On the other hand, depending on a laminate design, a retardation film can also be used as the element substrate layer. The retardation film may have a single-layer structure or may have a multi-layer structure. As the retardation film, it is possible to appropriately use a retardation film obtained by stretching and contracting a polymer film, or a retardation film in which a liquid crystal material is oriented and immobilized, depending on the intended use. The retardation film means a film which has a birefringence in in-plane and/or thickness directions, and thus realizes a given function. Examples of the retardation film include an antireflection retardation film, a viewing angle compensation retardation film, and a viewing angle compensation, obliquely-oriented retardation film. The retardation film is not particularly limited in terms, for example, of a retardation value, an arrangement angle, a three-dimensional birefringence, and whether it has a single-layer structure or a multi-layer structure, and it is possible to use any of various heretofore-known retardation films.

A thickness of the transparent element substrate is preferably in the range of 10 to 200 µm, more preferably in the range of 10 to 100 µm. If the thickness of the element substrate is less than 10 µm, mechanical strength of the transparent element substrate becomes insufficient, possibly causing difficulty in operation of continuously forming a transparent electroconductive thin film. On the other hand, if the thickness of the element substrate is greater than 200 µm, it is likely that a device using the optical film is increased in thickness, and conveyance and winding of the optical film becomes difficult.

The transparent element substrate may be formed with a single-layer or multi-layer functional layer on one or each of opposite surfaces thereof. Examples of the functional layer include an easy-adhesion layer, a refractive index adjustment layer, a hard coat (HC) layer, an anti-oligomerization layer, and a blocking layer (AB) layer. The functional layer may be formed by arbitrarily combining two or more of them. A surface of the transparent element substrate may be preliminarily subjected to sputtering, corona discharge, ultraviolet irradiation, electron beam irradiation, chemical conversion, etching such as oxidation, or undercoating to improve adhesion with respect to the functional film formed on the element substrate. Further, as necessary, before forming the functional film, the surface of the transparent element substrate may be subjected to dust removing and cleaning by means of solvent cleaning or ultrasonic cleaning.

Figure 4:
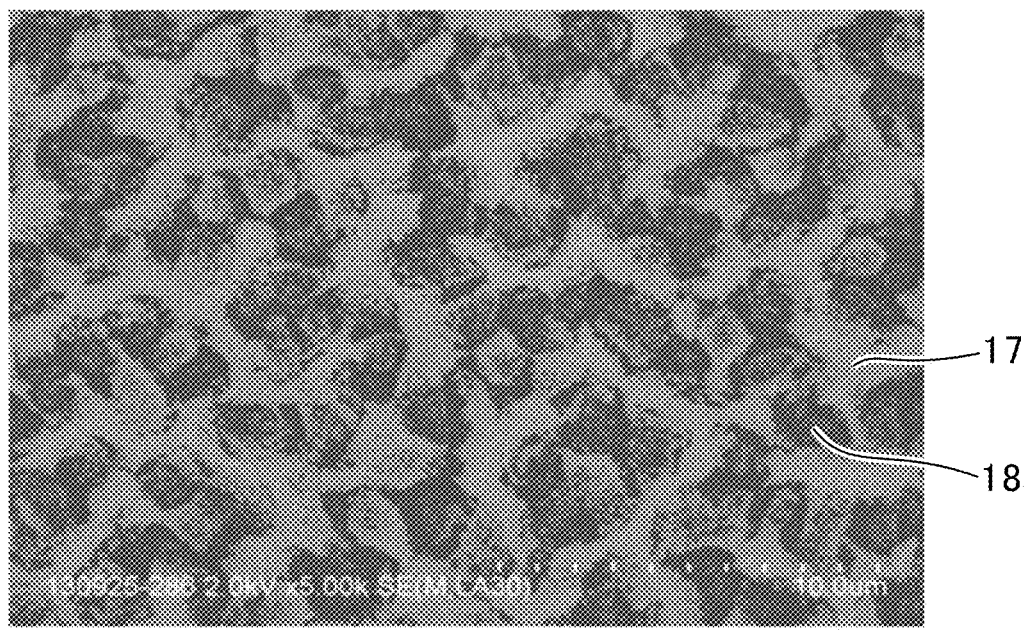
FIG. 4 is a top plan view depicting a state of a principal surface of the pressure-sensitive adhesive layer which is in contact with a second optical element.

As depicted in FIG. 3, the second principal surface 16 of the refractive index adjustment zone 13b of the pressure-sensitive adhesive layer 13 is bonded to respective pressure-sensitive adhesive layer-side surfaces of the second optical element 4 and the transparent electroconductive layer 7 in such a manner as to fill up a stepped space between the second optical element 4 and the transparent electroconductive layer 7. FIG. 4 is a top plan view depicting a state of the second principal surface 16 of the pressure-sensitive adhesive layer 13 in contact with the second optical element 4. As depicted in FIG. 4, a microstructure of the principal surface 16 is formed in a sea-island structure where the high refractive index material particles 17 are dispersed in a matrix 18 of the base pressure-sensitive adhesive material in the form of islands. In an interface where the pressure-sensitive adhesive layer 13 is in contact with the second optical element 4, there are a region where the base pressure-sensitive adhesive material is in contact with the second optical element 4 and a region where the high refractive index material particles 17 are in contact with the second optical element 4. Preferably, an area ratio of the high refractive index material particles 17 to a total of the high refractive index material particles 17 and the base pressure-sensitive adhesive material at the above position is set in the range of 30 to 99%.

The area ratio is calculated by measuring an area of the high refractive index material particles 17 in each of a plurality of square regions having a side length of 10 μm to 200 μm to obtain a ratio of the area of the high refractive index material particles 17 to the entire area of the square region, and averaging the area ratios measured in the plurality of square regions.

Figure 5A:
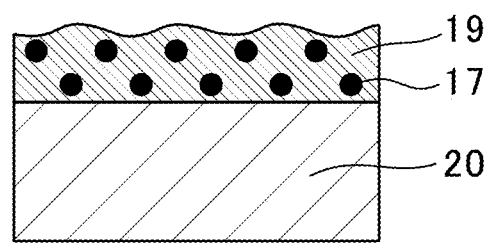
FIG. 5(a) is a schematic diagram illustrating a step of application of a dispersion liquid, in a process for preparing the pressure-sensitive adhesive layer depicted in FIG. 2.
Figure 5B:
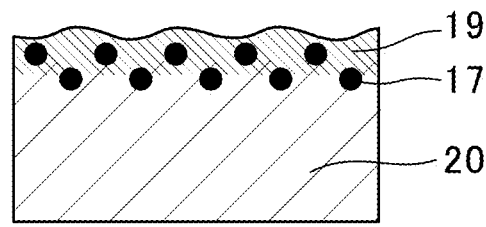
FIG. 5(b) is a schematic diagram illustrating a step of infiltration with high refractive index material particles, in the process for preparing the pressure-sensitive adhesive layer depicted in FIG. 2.
Figure 5C:
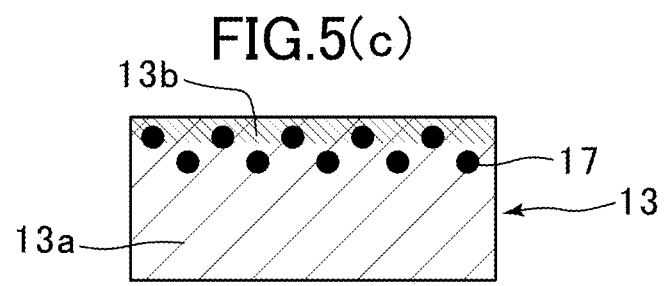
FIG. 5(c) is a schematic diagram illustrating a drying step, in the process for preparing the pressure-sensitive adhesive layer depicted in FIG. 2.

FIGS. 5(*a*), 5(*b*) and 5(*c*) schematically illustrate a process of producing the pressure-sensitive adhesive layer 13 in FIG. 2. First of all, a dispersion liquid 19 obtained by dispersing the high refractive index material particles 17 in a dispersion medium, and a matrix material-based pressure-sensitive adhesive layer 20, are preliminarily provided. Then, as depicted in FIG. 5(*a*), the dispersion liquid 19 is applied to a surface of the matrix material-based pressure-sensitive adhesive layer 20. Thus, the surface of the matrix material-based pressure-sensitive adhesive layer 20 is swelled by the dispersion medium of the dispersion liquid 19, and, in this process, the high refractive index material particles 17 in the dispersion liquid 19 infiltrate into the matrix material-based pressure-sensitive adhesive layer 20 in the thickness direction. This state is depicted in FIG. 5(*b*). Subsequently, the matrix material-based pressure-sensitive adhesive layer 20 infiltrated with the high refractive index material particles 17 is dried to vaporize the dispersion medium of the dispersion liquid 19 to obtain the pressure-sensitive adhesive layer 13 depicted in FIG. 2, i.e., a refractive index adjustment zone-formed pressure-sensitive adhesive layer. This state is depicted in FIG. 5(*c*).

An infiltration depth of the high refractive index material particles 17 with respect to the matrix material-based pressure-sensitive adhesive layer 20 is determined by a relationship between the base pressure-sensitive adhesive material and the dispersion medium of the dispersion liquid 19. The dispersion medium may be appropriately selected to enable the infiltration depth to become the aforementioned value.

FIG. 6(*a*) depicts a polarizing film laminate 40 comprising a transparent electroconductive layer patterned so as to function as a touch sensor, according to one embodiment of the present invention. Although the polarizing film laminate 40 is primarily used in a liquid crystal panel, it can also be used in any other type of display panel. The polarizing film laminate 40 comprises: an element substrate layer 42 which is a zero retardation film; a polarizer 41 attached to one surface of the element substrate 42; a patterned transparent electroconductive layer 43 formed on the other surface of the element substrate 42; and the refractive index adjustment zone-formed pressure-sensitive adhesive layer 13. The polarizing film laminate 40 is obtained by: forming the transparent electroconductive layer 43 on the element substrate layer 42; laminating the polarizer 41 to the element substrate layer 42 on a side opposite to the transparent electroconductive layer 43; and laminating the refractive index adjustment zone 13*b* of the pressure-sensitive adhesive layer 13 to the transparent electroconductive layer 43 and the element substrate layer 42, in such a manner that the patterned transparent electroconductive layer 43 is sandwiched between the refractive index adjustment zone 13*b* and the element substrate layer 42. The transparent electroconductive layer 43 can fulfill a touch sensor function. For example, it can function as a projected capacitive touch panel. Another electrode may be formed in or on a liquid crystal panel and used in combination with the transparent electroconductive layer 43 so as to form a capacitive touch panel. By using a zero retardation film as the element substrate layer 42, it becomes possible to prevent the occurrence of the coloration phenomenon, i.e., color shift, caused by light leaking from an oblique direction during black display, to enhance display uniformity of a liquid crystal panel. Further, by adjusting a refractive index of the refractive index adjustment zone 13*b* to set the refractive index to a value between a refractive index of the element substrate layer 42 and a refractive index of the transparent electroconductive layer 43, it becomes possible to suppress reflected light occurring at an interface between the refractive index adjustment zone 13*b* and the transparent electroconductive layer 43 and at an interface between the refractive index adjustment zone 13*b* and the element substrate layer 42. That is, the refractive index of the refractive index adjustment zone 13*b* is preferably less than that of the transparent electroconductive layer 43. In the case where the refractive index of the element substrate layer 42 is greater than that of the base material zone 13*a*, the refractive index of the refractive index adjustment zone 13*b* may be set to a value less than the refractive index of the element substrate layer 42, so as to place priority on suppressing reflection at an interface between the base material zone 13*a* and the refractive index adjustment zone 13*b*.

Figure 7A:
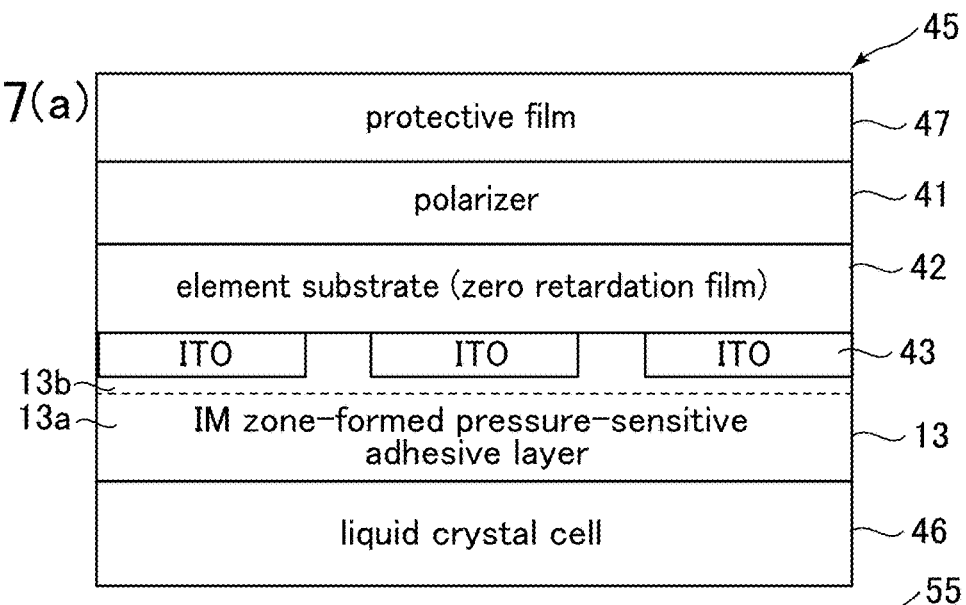
FIG. 7(a) is a schematic diagram depicting a configuration of a liquid crystal panel 45 according to one embodiment of the present invention.

FIG. 7(*a*) depicts a touch sensor-equipped liquid crystal panel 45, according to one embodiment of the present invention. The liquid crystal panel 45 can be obtained by laminating a protective film 47 to a viewing-side surface of the polarizer 41 of the polarizing film laminate 40, and laminating a non-viewing-side surface of the base material zone 13*a* of the pressure-sensitive adhesive layer 13 of the polarizing film laminate 40 to a liquid crystal cell 46. That is, the liquid crystal panel 45 comprises: the polarizing film laminate 40; a protective film 47 laminated to the polarizer 41 of the polarizing film laminate 40; and a liquid crystal cell 46 laminated to the base material zone 13*a* of the pressure-sensitive adhesive layer 13 of the polarizing film laminate 40. Although the liquid crystal cell 46 may be any type of liquid crystal cell, it is preferable to use an IPS liquid crystal cell. The polarizing film laminate 40 incorporates a touch sensor, so that there is an advantage of being able to reduce a thickness of the entire film.

FIG. 6(*b*) depicts a polarizing film laminate 50 comprising a pattered transparent electroconductive layer, according to one embodiment of the present invention. Although the polarizing film laminate 50 is primarily used in a liquid crystal panel, it can also be used in any other type of display panel. Although the polarizing film laminate 50 is different from the polarizing film laminate 40 in that an element substrate layer 52 is a retardation film such as a half wavelength retardation film or ¼ wavelength retardation film, they are identical to each other in the remaining configuration. By using a retardation film as the element substrate layer 52, it becomes possible to create circularly-polarized light so as to prevent light entering from the viewing side into an inside of the polarizing film laminate 50 from being internally reflected to go out toward the viewing side, and compensate for viewing angle. When an ITO layer is used as the transparent electroconductive layer 53, it needs to be heated and crystallized. In this case, the element substrate layer 52 has a relatively high glass transition temperature (Tg), so that it is possible to avoid deformation of the element substrate layer 52 due to the heating. For example, the glass transition temperature of the element substrate layer 52 is 160 degrees or more. A configuration of the transparent electroconductive layer 53 patterned so as to function as a tough sensor is the same as that of the transparent electroconductive layer 43 in the polarizing film laminate 40 or the liquid crystal panel 45.

Figure 7B:
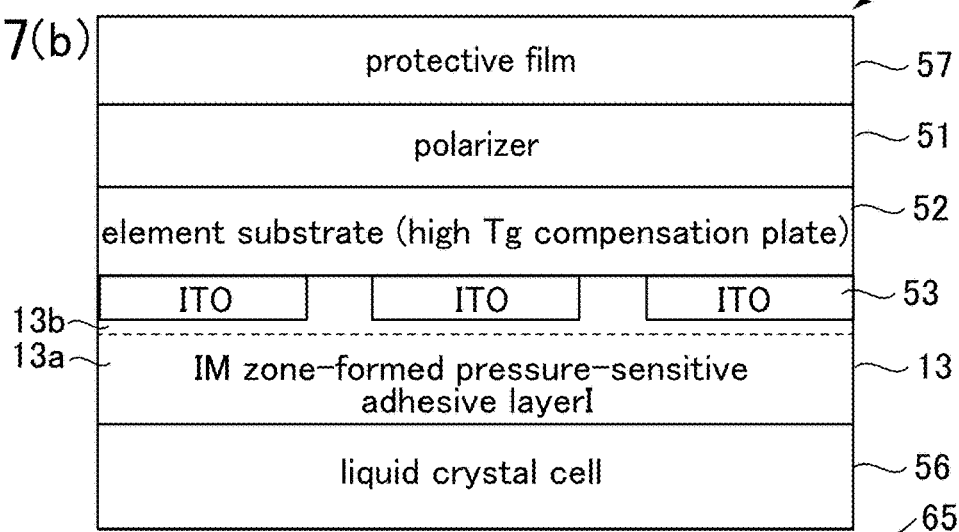
FIG. 7(b) is a schematic diagram depicting a configuration of a liquid crystal panel 55 according to one embodiment of the present invention.

FIG. 7(b) depicts a touch sensor-equipped liquid crystal panel 55, according to one embodiment of the present invention. The liquid crystal panel 55 can be obtained by laminating a protective film 57 to a viewing-side surface of the polarizer 51 of the polarizing film laminate 50, and laminating a non-viewing-side surface of the base material zone 13a of the pressure-sensitive adhesive layer 13 of the polarizing film laminate 50 to a liquid crystal cell 56.

FIG. 6(c) depicts a polarizing film laminate 60 comprising a patterned transparent electroconductive layer, according to one embodiment of the present invention. Although the polarizing film laminate 60 is primarily used in an organic EL panel, it can also be used in any other type of display panel. The polarizing film laminate 60 can be obtained by: forming a transparent electroconductive layer 63 on a viewing-side surface of an element substrate layer 62; laminating a viewing-side surface of the base material zone 13a of the pressure-sensitive adhesive layer 13 to a polarizer 61, and further laminating a non-viewing-side surface of the refractive index adjustment zone 13b of the pressure-sensitive adhesive layer 13 to the viewing-side surface of the element substrate layer 62 formed with the transparent electroconductive layer 63. The polarizing film laminate 60 further comprises a pressure-sensitive adhesive layer 64 for enabling the polarizing film laminate 60 to be laminated to a display panel or another optical element. A configuration of the transparent electroconductive layer 63 patterned so as to function as a tough sensor is the same as that of the transparent electroconductive layer 43 in the polarizing film laminate 40 or the liquid crystal panel 45.

The element substrate layer 62 is a ¼ wavelength retardation film. The ¼ wavelength retardation film is used to prevent reflection by a metal provided at a surface of an organic EL panel. A component of linearly-polarized light orthogonal to a transmission axis direction of the polarizer is absorbed by the polarizer. On the other hand, a component of the linearly-polarized light parallel to the transmission axis direction of the polarizer is transmitted through the polarizer. When an angle between the transmission axis direction of the polarizer and a slow axis of the ¼ wavelength retardation film is set to 45 degree, the ¼ wavelength retardation film can convert light transmitted through the polarizer into circularly-polarized light. The circularly-polarized light is reflected at a metal electrode, and re-enters the polarizer through the ¼ wavelength retardation film. A distance between the metal electrode and the ¼ wavelength retardation film, a thickness of the ¼ wavelength retardation film and others can be adjusted to cause the light passing through the ¼ wavelength retardation film to re-enter the polarizer at an angle perpendicular to the transmission axis direction of the polarizer, so that the component of the linearly-polarized light parallel to the transmission axis direction of the polarizer during the initial entry is also absorbed by the polarizer. Thus, it is possible to approximately completely eliminate surface reflection in an organic EL display device.

Figure 7C:
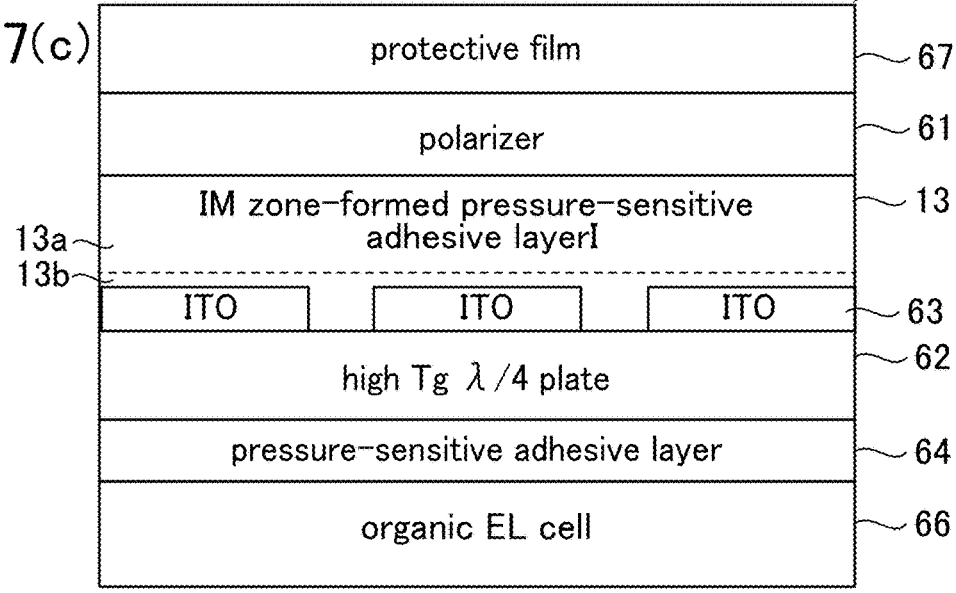
FIG. 7(c) is a schematic diagram depicting a configuration of a liquid crystal panel 65 according to one embodiment of the present invention.

FIG. 7(c) depicts a touch sensor-equipped organic EL panel 65 according to one embodiment of the present invention. The organic EL panel 65 can be obtained by laminating a protective film 67 to a viewing-side surface of the polarizer 61, and laminating a non-viewing-side surface of the pressure-sensitive adhesive layer 64 of the polarizing film laminate 60 to an organic EL cell 66.

Figure 8:
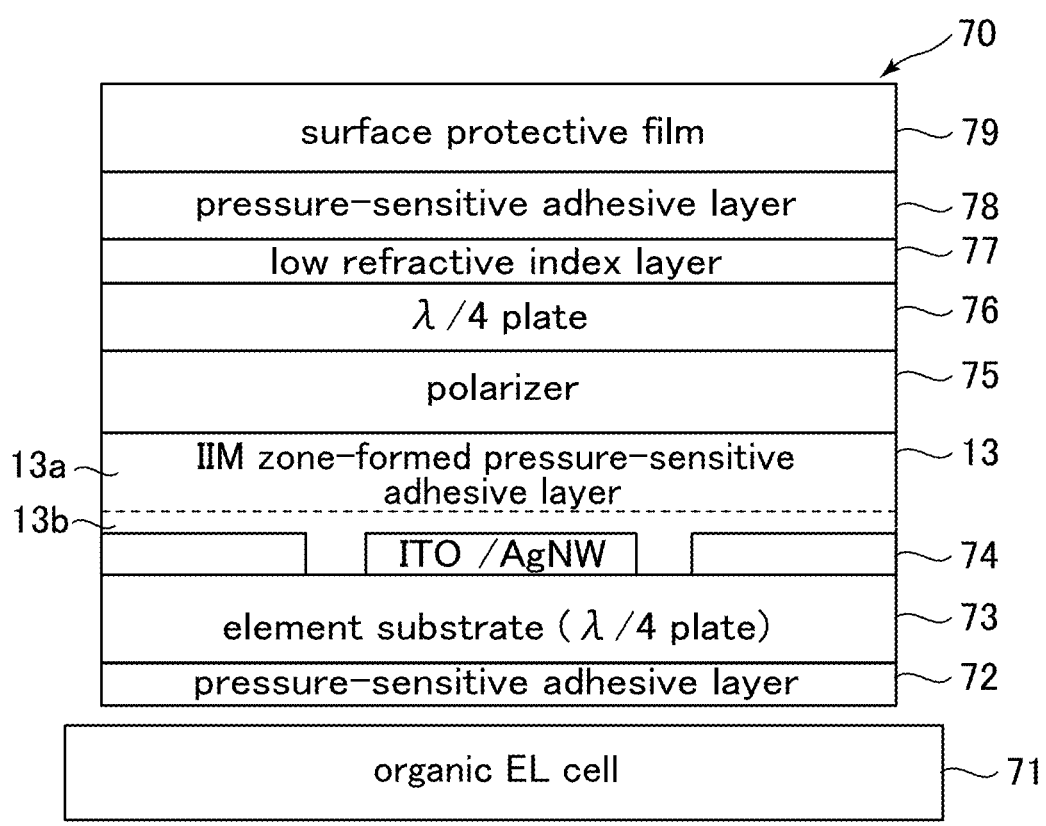
FIG. 8 is a schematic diagram depicting a configuration of an organic EL panel according to one embodiment of the present invention.

FIG. 8 depicts a touch sensor-equipped organic EL panel 70 using the polarizing film laminate 60, according to one embodiment of the present invention. The organic EL panel 70 comprises an organic EL cell 71, a pressure-sensitive adhesive layer 72, a λ/4 retardation plate 73, a transparent electrode layer 74, the pressure-sensitive adhesive layer 13 arranged such that the refractive index adjustment zone 13b is located on the side of the display panel, a polarizer 75, λ/4 retardation plate 76, a low refractive index layer 77, a pressure-sensitive adhesive layer 78, and a surface protective film 79, which are arranged in this order from the side of the display panel. A polarizing film laminate 80 according to one embodiment of the present invention comprises the pressure-sensitive adhesive layer 72, the λ/4 retardation plate 73, the transparent electrode layer 74, the pressure-sensitive adhesive layer 13 arranged such that the base material zone 13a is located on the viewing side, and the polarizer 75.

The λ/4 retardation plate 73 has a function of preventing the occurrence of reflected light in cooperation with the polarizer 75, as mentioned above. The transparent electrode layer 74 is patterned so as to function as a touch sensor. The transparent electrode layer 74 may be made of a transparent electroconductive metal such as crystallized ITO, or may be formed of silver nanowires. The refractive index adjustment zone 13b of the pressure-sensitive adhesive layer 13 is laminated to each of the pattered transparent electrode layer 74 and the λ/4 retardation plate 73, so that it is possible to reduce a difference in refractive index at an interface therebetween and thus lower a reflectance. This makes it possible to enable the pattern to become less likely to be viewed from the outside.

As the polarizer, it is preferable to use a thinned polarizer having a thickness of 10 µm or less. Generally, a polarizer is likely to undergo thermal contraction. That is, as a thickness of the polarizer becomes larger, a stress arising from thermal contraction becomes larger, leading to a higher risk of damaging a display panel. Therefore, by employing such a thinned polarizer having a thickness of 10 µm or less, it becomes possible to reduce a stress caused by the polarizer and minimize the risk of damaging a display panel.

The λ/4 retardation plate 76 is used to enable a screen to be viewed even in a situation where a use of the organic EL display device 70 wears sunglasses. That is, in the case where a polarizing plate is used in sunglasses, when image light generated from a display device has a linearly-polarized component, the image light is partially blocked by the sunglasses, resulting in a darkened image. Image light converted into linearly-polarized light through the polarizer 75 is converted into circularly-polarized light, so that a user can view an image at sufficient brightness even when he/she wears sunglasses.

EXAMPLES

The present invention will be further described below, based on examples.
[Production of Base Pressure-Sensitive Adhesive Materials]
<Production of Acrylic Oligomer>

60 weight parts of dicyclopentanyl methacrylate (DCPMA), 40 weight parts of methyl methacrylate (MMA), 3.5 weight parts of α-thioglycerol as a chain transfer agent, and 100 weight parts of toluene as a polymerization medium were put into a four-neck flask, and stirred in a nitrogen atmosphere at 70° C. for 1 hour. Then, 0.2 weight parts of 2,2'-azobisisobutyronitrile as a polymerization initiator was put into the four-neck flask to cause a reaction at 70° C. for 2 hours, followed by a further reaction at 80° C. for 2 hours. Then, the resulting reaction solution was placed in an atmosphere at 130° C. to remove the toluene, the chain transfer agent and unreacted monomers therefrom by drying to thereby obtain an acrylic-based polymer in a solid form. The acrylic-based polymer obtained in this manner was named as "acrylic-based polymer (A-1)". A weight-average molecular weight (Mw) of the acrylic-based polymer (A-1) was $5.1 \times 10^3$.

<Production of Pressure-Sensitive Adhesive Layer A>

0.035 weight parts of a photopolymerization initiator (trade name: "IRGACURE 184", manufactured by BASF SE.) and 0.035 weight parts of a photopolymerization initiator (trade name "IRGACURE 651" manufactured by BASF SE.) were added to a monomer mixture of 68 weight parts of 2-ethylhexyl acrylate (2EHA), 14.5 weight parts of N-vinyl-2-pyrrolidone (NVP) and 17.5 weight parts of 2-hydroxyethyl acrylate (HEA), and then the resulting monomer mixture was exposed to ultraviolet light in a nitrogen atmosphere in such a manner as to be partially photopolymerized, thereby obtaining a partially polymerized product having a polymerization rate of about 10 weight % (acrylic-based polymer syrup).

Then, 5 weight parts of the acrylic-based polymer (A-1), 0.15 weight parts of hexanediol diacrylate (HDDA) and 0.3 weight parts of a silane coupling agent (trade name: "KBM-403", manufactured by Shin-Etsu Chemical Co., Ltd.) were added to and uniformly mixed with the acrylic-based polymer syrup obtained in the above manner to obtain an acrylic-based pressure-sensitive adhesive composition. The acrylic-based pressure-sensitive adhesive composition was applied onto a release-treated surface of a separator film (trade name: "DIAFOIL MRF#38", manufactured by Mitsubishi Plastics, Inc.) in such a manner that a thickness thereof after being formed as a matrix material-based pressure-sensitive adhesive layer becomes 23 μm, thereby forming a pressure-sensitive adhesive composition layer. Then, a separator film (trade name: "DIAFOIL MRF#38", manufactured by Mitsubishi Plastics, Inc.) was attached onto a surface of the pressure-sensitive adhesive composition layer in such a manner that a release-treated surface of the separator film faces the applied layer. In this way, the applied layer of the monomer component is blocked from oxygen. Subsequently, the pressure-sensitive adhesive composition layer was irradiated with ultraviolet light in such a manner as to be photocured, under conditions including illuminance: 5 mW/cm², and light intensity: 1,500 mJ/cm², thereby forming a pressure-sensitive adhesive layer A.

<Production of Pressure-Sensitive Adhesive Layer B>

28.5 weight parts of 2-ethylhexyl acrylate (2EHA), 28.5 weight parts of isostearyl acrylate (ISTA), 22 weight parts of isobornyl acrylate, 20 weight parts of 4-hydroxybutyl acrylate (4HBA), and two types of photopolymerization initiators: 0.05 weight parts of a photopolymerization initiator (trade name: "IRGACURE 184", manufactured by BASF SE.) and 0.05 weight parts of a photopolymerization initiator (trade name: "IRGACURE 651", manufactured by BASF) were mixed together, and the resulting monomer mixture was exposed to ultraviolet light in a nitrogen atmosphere in such a manner as to be partially photopolymerized, thereby obtaining a partially polymerized product (acrylic-based polymer syrup) having a polymerization rate of about 10 weight %.

Then, 0.3 weight parts of hexanediol diacrylate (HDDA) and 0.3 weight parts of a silane coupling agent (trade name: "KBM-403", manufactured by Shin-Etsu Chemical Co., Ltd.) were added to and evenly mixed with the acrylic-based polymer syrup obtained in the above manner to obtain an acrylic-based pressure-sensitive adhesive composition. The acrylic-based pressure-sensitive adhesive composition was applied onto a release-treated surface of a separator film (trade name: "DIAFOIL MRF#38", manufactured by Mitsubishi Plastics, Inc.) in such a manner that a thickness thereof after being formed as a matrix material-based pressure-sensitive adhesive layer becomes 23 μm, thereby forming a pressure-sensitive adhesive composition layer. Then, a separator film (trade name: "DIAFOIL MRF#38", manufactured by Mitsubishi Plastics, Inc.) was attached onto a surface of the pressure-sensitive adhesive composition layer in such a manner that a release-treated surface of the separator film faces the applied layer. In this way, the applied layer of the monomer component is blocked from oxygen. Subsequently, the pressure-sensitive adhesive composition layer was irradiated with ultraviolet light in such a manner as to be photocured, under conditions including illuminance: 5 mW/cm², and light intensity: 1,500 mJ/cm², thereby forming a pressure-sensitive adhesive layer B.

<Preparation of Pressure-Sensitive Adhesive Layer C1>

32 weight parts of 2-ethylhexyl acrylate (2EHA), 48 weight parts of isostearyl acrylate (ISTA), 20 weight parts of 2-hydroxypropyl acrylate (2HPA), and two types of photopolymerization initiators: 0.05 weight parts of a photopolymerization initiator (trade name: "IRGACURE 184", manufactured by BASF SE.) and 0.05 weight parts of a photopolymerization initiator (trade name: "IRGACURE 651", manufactured by BASF) were put into a four-neck flask to prepare a monomer mixture. Then, this monomer mixture was exposed to ultraviolet light in a nitrogen atmosphere in such a manner as to be partially photopolymerized, thereby obtaining a partially polymerized product (acrylic-based polymer syrup) having a polymerization rate of about 10 weight %. 0.02 weight parts of trimethylolpropane triacrylate (TMPTA) and 0.3 weight parts of a silane coupling agent (trade name: "KBM-403", manufactured by Shin-Etsu Chemical Co., Ltd.) were added to 100 weight parts of the acrylic-based polymer syrup obtained in the above manner, and uniformly mixed together, thereby obtaining an acrylic-based pressure-sensitive adhesive composition. The acrylic-based pressure-sensitive adhesive composition was applied onto a release-treated surface of a separator film (trade name: "DIAFOIL MRF#38", manufactured by Mitsubishi Plastics, Inc.) in such a manner that a thickness thereof after being formed as a matrix material-based pressure-sensitive adhesive layer becomes 23 μm, thereby forming a pressure-sensitive adhesive composition layer. Then, a separator film (trade name: "DIAFOIL MRF#38", manufactured by Mitsubishi Plastics, Inc.) was attached onto a surface of the pressure-sensitive adhesive composition layer in such a manner that a release-treated surface of the separator film faces the applied layer. In this way, the applied layer of the monomer component is blocked from oxygen. Subsequently, the pressure-sensitive adhesive composition layer was irradiated with ultraviolet light in such a manner as to be photocured, under conditions including illuminance: 5 mW/cm², and light intensity: 1,500 mJ/cm², thereby forming a pressure-sensitive adhesive layer C1.

<Preparation of Pressure-Sensitive Adhesive Layer C2>

A pressure-sensitive adhesive layer C1 was produced in the same manner as that for the pressure-sensitive adhesive layer C1, except that the acrylic-based pressure-sensitive adhesive composition was applied such that a thickness thereof after being formed as a matrix material-based pressure-sensitive adhesive layer becomes 100 μm.

[Production of Refractive Index Adjustment Zone-Formed Pressure-Sensitive Adhesives]
<Case of Using Pressure-Sensitive Adhesive Layer A & High Refractive Index Material Nanoparticle Dispersion Liquid>
(Case of using pressure-sensitive adhesive layer A & nanoparticle dispersion liquid)

A 23 μm-thick pressure-sensitive adhesive layer A (refractive index: 1.49) having opposite surfaces each protected by a lightly-peelable PET separator sheet was prepared, and one of the lightly-peelable PET separator sheets was peeled off. A coating liquid (dispersion medium: ethanol, particle concentration: 1.2 weight %, transmittance of dispersion liquid: 82%; manufactured by CIK Nanotech Co., Ltd.) containing zirconia particles ($ZrO_2$, refractive index: 2.17, average primary particle size: 20 nm) and serving as a dispersion liquid containing high refractive index particles was applied to the exposed surface of the matrix material-based pressure-sensitive adhesive layer by using a bar coater RDS No. 5 in such a manner as to form a refractive index adjustment zone having a thickness of 20 nm to 200 nm, and dried in a drying oven at 110° C. for 180 seconds. Then, a PET separator sheet (75 μm) serving as a support (backing) was attached onto a surface of the resulting pressure-sensitive adhesive layer in which the zirconia ($ZrO_2$) particles are dispersed, thereby obtaining a refractive index adjustment zone-formed pressure-sensitive adhesive layer (1). An average primary particle size of the zirconia particles was measured by TEM observation.

(Other Cases)

Using the following base pressure-sensitive adhesive materials and high refractive index material nanoparticle dispersion liquids, two refractive index adjustment zone-formed pressure-sensitive adhesive layers (2) and (3) were produced in the same manner as that in the above case. Materials used were the pressure-sensitive adhesive layer B (refractive index: 1.48), the pressure-sensitive adhesive layer C1 (refractive index: 1.48) and the $ZrO_2$ nanoparticle dispersion liquid (dispersion medium: ethanol, particle size: 20 nm).

Properties of the above pressure-sensitive adhesive layers are summarized in Table 1.

TABLE 1

| Refractive Index Adjustment Zone-Formed Pressure-Sensitive Adhesive Layer | Base Pressure-Sensitive Adhesive Material Type | Thickness μm | High Refractive Index Material | Production Method | Properties of Refractive Index Adjustment Zone in Laminate | | | | |
|---|---|---|---|---|---|---|---|---|---|
| | | | | | Average Interfacial Refractive Index $n_D$ | Thickness of High Refractive Index Layer [nm] | Total Light Transmittance [%] | Haze Value | Adhesive Force at Surface of Refractive Index Adjustment Zone [N/25 mm] |
| Refractive index adjustment zone-formed pressure-sensitive adhesive layer (1) | (A) Refractive index: 1.49 | 23 | Zirconium oxide (average particle size 20 nm) | Ethanol dispersion liquid (Solid content 1.2 wt %, Trasmittance of dispersion liquid 82%) is applied and dried to form refractive index adjustment zone having thickness of 20 nm to 200 nm | 1.66 | 150 | 92.3 | 0.5 | 9 |
| Refractive index adjustment zone-formed pressure-sensitive adhesive layer (2) | (B) Refractive index: 1.48 | 23 | Zirconium oxide (average particle size 20 nm) | Ethanol dispersion liquid (Solid content 1.2 wt %, Trasmittance of dispersion liquid 82%) is applied and dried to form refractive index adjustment zone having thickness of 20 nm to 200 nm | 1.75 | 120 | 92.3 | 0.4 | 7 |
| Refractive index adjustment zone-formed pressure-sensitive adhesive layer (3) | (C) Refractive index: 1.48 | 23 | Zirconium oxide (average particle size 20 nm) | Ethanol dispersion liquid (Solid content 1.2 wt %, Trasmittance of dispersion liquid 82%) is applied and dried to form refractive index adjustment zone having thickness of 20 nm to 200 nm | 1.72 | 160 | 92.3 | 0.4 | 9 |
| Pressure-sensitive adhesive layer A (base material) | (A) Refractive index: 1.49 | 23 | — | — | — | — | 92.3 | 0.4 | 13 |
| Pressure-sensitive adhesive layer B (base material) | (B) Refractive index: 1.48 | 23 | — | — | — | — | 92.3 | 0.4 | 10 |
| Pressure-sensitive adhesive layer C1 (base material) | (C) Refractive index: 1.48 | 23 | — | — | — | — | 92.3 | 0.4 | 14 |
| Pressure-sensitive adhesive layer C2 (base material) | (C) Refractive index: 1.48 | 100 | — | — | — | — | 92.3 | 0.4 | 19 |

[Production of Electroconductive Layer-Laminated Element Substrate Layer]
<Production of Transparent Electroconductive Layer Using Zero Retardation Element Substrate Layer>

A coating liquid prepared by adding 0.07 parts of a plurality of 3 μm-diameter particles (trade name: "SSX105", manufactured by Sekisui Jushi Corp.) to 100 parts of binder resin (trade mark "UNIDIC RS29-120", manufactured by DIC Corp.) was applied to each of opposite surfaces of a 100

μm-thick cycloolefin polymer film (trade name: "ZEONOA ZF16", manufactured by Nippon Zeon Co., Ltd., in-plane birefringence: 0.0001) by using a bar coater, and dried in an oven at 80° C. for 1 minute. Then, the resulting film was irradiated with ultraviolet light (high-pressure mercury vapor lamp) in an integrated amount of 300 mJ/cm$^2$, thereby forming a cycloolefin polymer film having anti-blocking layers on respective opposite surfaces thereof (this film will hereinafter be referred to as "COP element substrate"). Then, a refractive index adjuster (trade name: "OPSTAR KZ6661", manufactured by JSR Corp.) was applied to one surface of the COP element substrate by using a bar coater, and dried in an oven at 80° C. for 1 minute. Then, the resulting COP element substrate was irradiated with ultraviolet light (high-pressure mercury vapor lamp) in an integrated amount of 300 mJ/cm$^2$, so that a 100 nm-thick refractive index adjustment layer having a refractive index of 1.65 was formed on the one surface of the COP element substrate. Then, a 23 nm-thick indium tin oxide (ITO) layer serving as a transparent electroconductive layer is deposited on a surface of the refractive index adjustment layer on the COP element substrate, by using a winding type sputtering apparatus. After a photoresist film is formed on a portion of the transparent electroconductive layer, the resulting laminate was immersed in an aqueous solution containing 5 weight % of hydrochloric acid (aqueous hydrogen chloride solution) at a temperature of 25° C., for 1 minute, so as to subject the transparent electroconductive layer to etching. Through the etching, a non-etched area (patterned portion) corresponding to an electrode wiring pattern, and an etchingly removed area (opening), are formed in the transparent electroconductive layer (i.e., a patterned transparent electroconductive layer-laminated element substrate layer (1) was produced).

<Production of Transparent Electroconductive Layer Using λ/4 Retardation Film as Element Substrate>

A patterned transparent electroconductive layer-laminated element substrate layer (2) was produced in the same manner as that for the patterned transparent electroconductive layer-laminated element substrate layer (1), except that an element substrate to be used was changed to a 100 μm-thick cycloolefin polymer film (manufactured by Nippon Zeon Co., Ltd., in-plane retardation Re: 140 nm) imparted with a retardation property.

[Production of Polarizing Film]

<Production of Electroconductive Layer-Containing Polarizing Film (1)>

A 30 μm-thick polyvinyl alcohol film was stretched to 3 times between roll pairs having different feed speeds while being dyed in a solution containing iodine in a concentration of 0.3% and having a temperature of 30° C., for 1 minute. Then, the film was further stretched to attain a total stretching ratio of 6 times, while being immersed in an aqueous solution containing potassium iodide in a concentration of 10%, for 0.5 minutes. Subsequently, the stretched film was immersed in an aqueous solution containing potassium iodide in a concentration of 1.5% and having a temperature of 30° C., for 10 seconds so as to be cleaned, and dried at 50° C. for 4 minutes, thereby obtaining a 12 μm-thick polarizer (A-1). Then, an aqueous PVA-based resin solution was applied to each of opposite surfaces of the polarizer (A-1). The 100 μm-thick patterned transparent electroconductive layer-laminated element substrate (1) was laminated to one of the surfaces in such a manner that the patterned transparent electroconductive layer was oriented outwardly, and a triacetylcellulose film (hereinafter referred to as "TAC film") comprising a hard coat layer and having a total thickness of 43 μm was laminated to the other surface. Then, the resulting laminate was dried to produce an electroconductive layer-containing polarizing film (1). The obtained electroconductive layer-containing polarizing film (1) had a transmittance of 43% and a polarization degree of 99.9%.

<Production of Electroconductive Layer-Containing Polarizing Film (2)>

A 23 μm-thick polarizer (A-2) was produced in the same manner as that for the polarizer (A-1), except that the thickness of the polyvinyl alcohol film was changed to 60 μm, and the concentration of the solutions, the immersion time and others were adjusted to cause a resulting polarizing film to have a transmittance of 45%. Then, an aqueous PVA-based resin solution was applied to each of opposite surfaces of the polarizer (A-2). A 100 μm-thick patterned transparent electroconductive layer-laminated element substrate (2) was laminated to one of the surfaces in such a manner that a slow axis of an element substrate (λ/4 retardation plate) thereof was disposed at an angle of 45 degrees with respect to an absorption axis of the polarizer (A-2), and the patterned transparent electroconductive layer was oriented outwardly, and a TAC film comprising an antireflection (AR) layer and having a total thickness of 43 μm was laminated to the other surface. Then, the resulting laminate was dried to produce an electroconductive layer-containing polarizing film (2). The obtained electroconductive layer-containing polarizing film (2) had a transmittance of 45% and a polarization degree of 99.8%.

<Production of Polarizing Film (3)>

A thermoplastic resin substrate (elongate-shaped non-crystallizable polyethylene terephthalate film, thickness: 100 μm, water absorption rate: 0.60 weight %, Tg: 80° C.) was prepared, and one surface thereof was subjected to a corona treatment. Then, an aqueous polyvinyl alcohol solution having a polymerization degree of 4200 and a saponification degree of 99.2 mol % was applied at 60° C. to the corona-treated surface, and dried to form a 10 μm-thick PVA-based resin layer, thereby producing a laminate.

The obtained laminate was stretched to 2.0 times in a machine direction (longitudinal direction) in a free-end uniaxial manner (auxiliary in-air stretching) between roll pairs having different feed speeds, within an oven at 120° C., and then the resulting laminate was immersed in an insolubilization bath (an aqueous boric acid solution obtained by adding 4 weight parts of boric acid to 100 weight parts of water) at a solution temperature of 30° C., for 30 seconds (insolubilization treatment).

The insolubilized laminate was immersed in a dyeing both (an aqueous iodine solution obtained by adding 0.2 weight parts of iodine and 1.0 weight part of potassium iodide to 100 weight parts of water) at a solution temperature of 30° C., for 60 seconds (dyeing treatment), and then the resulting laminate was immersed in a cross-linking bath (an aqueous boric acid solution obtained by adding 3 weight parts of potassium iodide and 3 weight parts of boric acid to 100 weight parts of water) at a solution temperature of 30° C., for 30 seconds (cross-linking treatment).

Subsequently, the obtained laminate was stretched in the machine direction (longitudinal direction) in a uniaxial manner (in-solution stretching) between roll pairs having different feed speeds, while being immersed in an aqueous baric acid solution (an aqueous solution obtained by adding 4 weight parts of boric acid and 5 weight parts of potassium iodide to 100 weight parts of water) at a solution temperature of 70° C., for 30 seconds, so as to attain a total stretching ratio of 5.5 times, and then the resulting laminate was immersed in a cleaning bath (an aqueous solution obtained by adding 4 weight parts of potassium iodide to 100 weight parts of water) at a solution temperature of 30° C. (cleaning treatment).

Through the above series of treatments, an optical film laminate comprising a 5 μm-thick polarizer (B-1) was obtained on the resin substrate.

Subsequently, an aqueous PVA-based resin solution was applied to one of opposite surfaces of the polarizer (B-1) of the obtained optical film laminate, and heated in a oven maintained at 60° C., for 5 minutes. Then, the thermoplastic resin substrate was peeled off to produce a polarizing film (3).

The obtained polarizing film (3) had a transmittance of 44% and a polarization degree of 99.8%.

Figure 10A:
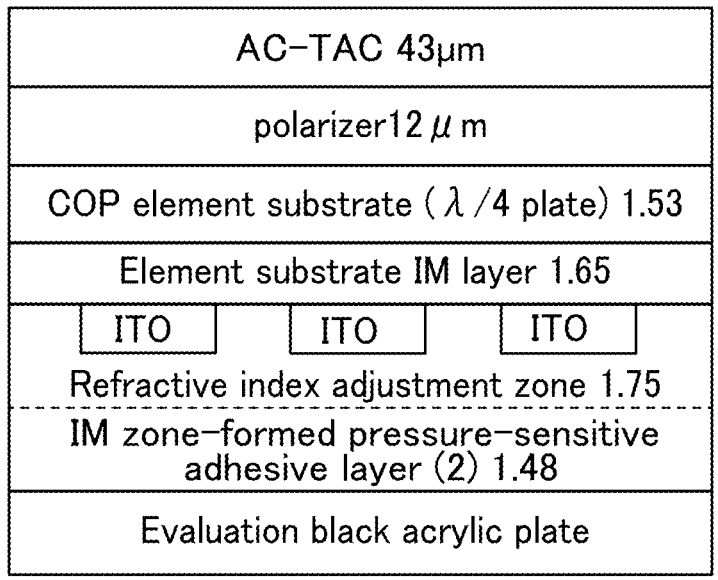
FIG. 10(a) is schematic diagram depicting a configuration of a polarizing film laminate in Inventive Example 2.

Properties of the above polarizing films (1) to (3) are summarized in Table 2.

wherein the PET separator sheet on a surface of the refractive index adjustment zone of the refractive index adjustment zone-formed pressure-sensitive adhesive layer (2) was peeled off, and the exposed surface of the refractive index adjustment zone was laminated to the patterned transparent electroconductive layer-laminated element substrate (2) of the electroconductive layer-containing polarizing film (2), in such a manner that the refractive index adjustment zone is brought into contact with the patterned transparent electroconductive layer. A configuration of the polarizing film laminate (B) in Inventive Example 2 is depicted in FIG. 10(a).

Inventive Example 3

The PET separator sheet on a surface of the base adhesive zone of the refractive index adjustment zone-formed pres-

TABLE 2

| | | Configuration of Polarizing Plate | | | | | |
|---|---|---|---|---|---|---|---|
| | Transparent | Property of Polarizer | | | Transparent | | |
| Polarizing Film | Protective Film (outsiude) | Polarizer | Thickness (μm) | Single transmittance | Polarization degree | Protective Film (Cell side) | Base Film of Electroconductive Film |
| (1) | HC-TAC (43 μm) | Polarizer (A-1) | 12 | 43% | 99.9% | Transparent electroconductive layer-laminated base film layer(1) | Zero retardation film (COP) |
| (2) | AR-TAC (43 μm) | Polarizer (A-2) | 23 | 45% | 99.8% | Transparent electroconductive layer-laminated base film layer(2) | λ/4 retardation film (COP) |
| (3) | Acrylic (20 μm) | Polarizer (B-1) | 5 | 44% | 99.8% | Transparent electroconductive layer-laminated base film layer(2) | λ/4 retardation film (COP) |

Specific inventive examples and comparative examples of a polarizing film laminate will be described below. It is to be understood that the present invention is not limited to the following examples.

[Production of Pressure-Sensitive Adhesive Layer and Electroconductive Layer-Containing Polarizing Film Laminate]

Inventive Example 1

Figure 9A:
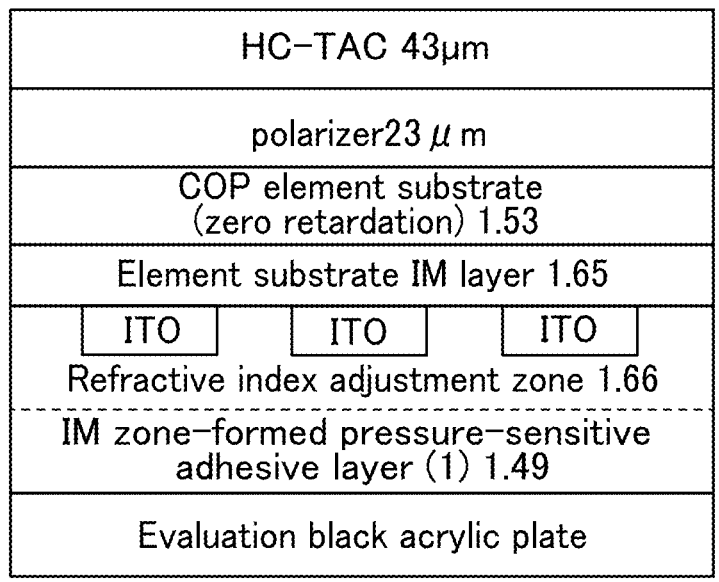
FIG. 9(a) is schematic diagram depicting a configuration of a polarizing film laminate in Inventive Example 1.

The PET separator sheet on a surface of the refractive index adjustment zone of the refractive index adjustment zone-formed pressure-sensitive adhesive layer (1) was peeled off, and the exposed surface of the refractive index adjustment zone was laminated to the patterned transparent electroconductive layer-laminated element substrate (1) of the electroconductive layer-laminated polarizing film (1), thereby producing a polarizing film laminate (A) in which the refractive index adjustment zone is in contact with the patterned transparent electroconductive layer. A configuration of the polarizing film laminate (A) in Inventive Example 1 is depicted in FIG. 9(a).

Inventive Example 2

A polarizing film laminate (B) was produced in the same manner as that in Inventive Example 1, except that a pressure-sensitive adhesive layer and an electroconductive layer-containing polarizing film to be laminated were changed, respectively, to the refractive index adjustment zone-formed pressure-sensitive adhesive layer (2) and the electroconductive layer-containing polarizing film (2), sure-sensitive adhesive layer (2) was peeled off, and the exposed surface of the base adhesive zone was laminated to the polarizer (B-1) of the polarizing film (3). Then, the PET separator sheet on a surface of the refractive index adjustment zone of the refractive index adjustment zone-formed pressure-sensitive adhesive layer (2) was peeled off, and the exposed surface of the refractive index adjustment zone was laminated to the patterned transparent electroconductive layer-laminated element substrate (2) in such a manner that the refractive index adjustment zone is brought into contact with the patterned transparent electroconductive layer. Further, the 23 μm-thick pressure-sensitive adhesive layer A was laminated to the element substrate layer of the patterned transparent electroconductive layer-laminated element substrate layer (2) of the resulting laminate, thereby producing a polarizing film laminate (C) additionally having the pressure-sensitive adhesive layer A. A configuration of the polarizing film laminate (C) in Inventive Example 3 is depicted in FIG. 11(a).

Inventive Example 4

A laminate was produced in the same manner as that in Inventive Example 3, except that the refractive index adjustment zone-formed pressure-sensitive adhesive layer (2) was changed to the refractive index adjustment zone-formed pressure-sensitive adhesive layer (3). Then, the 100 μm-thick pressure-sensitive adhesive layer C2 was laminated to the acrylic-based film of the laminate, thereby producing a polarizing film laminate (D) additionally having the pressure-sensitive adhesive layers A, C2 on opposite surfaces thereof. A configuration of the polarizing film laminate (D) in Inventive Example 4 is depicted in FIG. 12(a).

Comparative Example 1

Figure 9B:
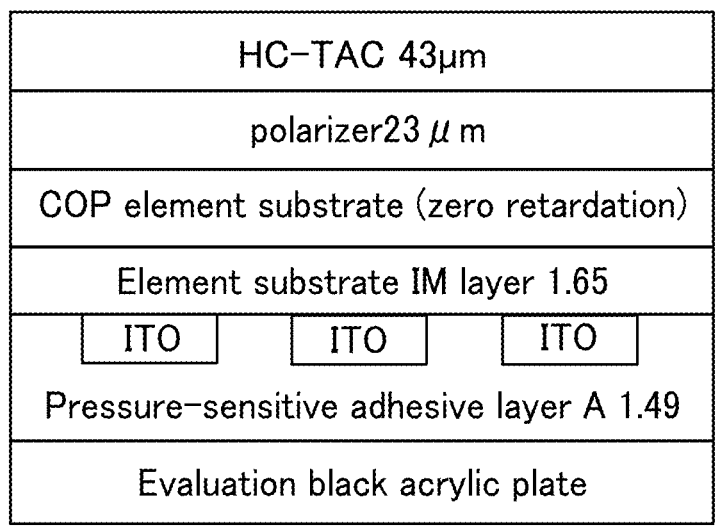
FIG. 9(b) is schematic diagram depicting a configuration of a polarizing film laminate in Comparative Example 1.

A polarizing film laminate (E) was produced in the same manner as that in Inventive Example 1, except that the refractive index adjustment zone-formed pressure-sensitive adhesive layer (1) in Inventive Example 1 was changed to the pressure-sensitive adhesive layer A devoid of the refractive index adjustment zone. A configuration of the polarizing film laminate (E) in Comparative Example 1 is depicted in FIG. 9(b).

Comparative Example 2

Figure 10B:
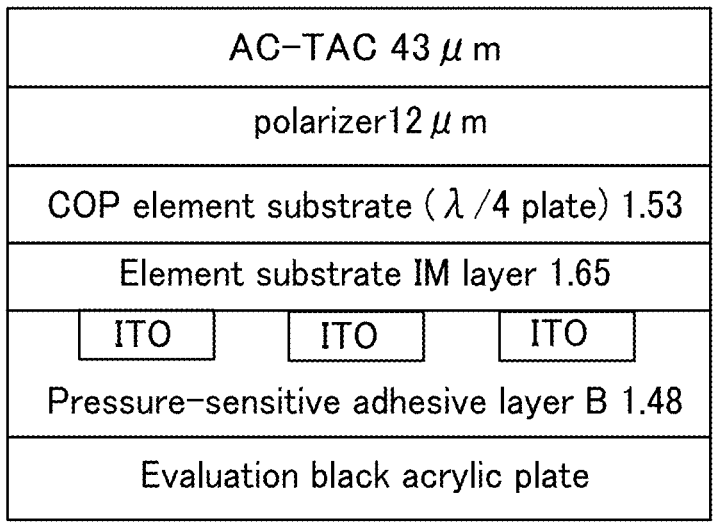
FIG. 10(b) is schematic diagram depicting a configuration of a polarizing film laminate in Comparative Example 2.

A polarizing film laminate (F) was produced in the same manner as that in Inventive Example 2, except that the refractive index adjustment zone-formed pressure-sensitive adhesive layer (2) in Inventive Example 2 was changed to the pressure-sensitive adhesive layer B devoid of the refractive index adjustment zone. A configuration of the polarizing film laminate (F) in Comparative Example 2 is depicted in FIG. 10(b).

Comparative Example 3

A polarizing film laminate (G) was produced in the same manner as that in Inventive Example 3, except that the refractive index adjustment zone-formed pressure-sensitive adhesive layer (2) in Inventive Example 3 was changed to the pressure-sensitive adhesive layer B devoid of the refractive index adjustment zone. A configuration of the polarizing film laminate (G) in Comparative Example 3 is depicted in FIG. 11(b).

Comparative Example 4

A polarizing film laminate (F) was produced in the same manner as that in Inventive Example 4, except that the refractive index adjustment zone-formed pressure-sensitive adhesive layer (3) in Inventive Example 4 was changed to the pressure-sensitive adhesive layer C1 devoid of the refractive index adjustment zone. A configuration of the polarizing film laminate (H) in Comparative Example 4 is depicted in FIG. 12(b).

[Evaluation Method]

<Measurement of Single Transmittance and Polarization Degree of Polarizer>

A single transmittance (Ts), a parallel transmittance (Tp) and a crossed transmittance (Tc) of a polarizer were measured using a UV-visible spectrophotometer (V7100 manufactured by JASCO Corporation), and a polarization degree (P) was derived from the following formula:

Polarization degree$(P)(\%) = \{(Tp-Tc)/(Tp+Tc)\} \times (1/2) \times 100$

Each value of Ts, Tp and Tc is a Y value measured by the 2-degree visual field (C light source) of JIS Z8701 and corrected for spectral luminous efficacy.

<Measurement of Weight Average Molecular Weight (Mw) of Acryl-Based Polymer>

A weight average molecular weight of the produced acryl-based polymer was measured by gel permeation chromatography (GPC).

Apparatus: HLC-8220 GPC manufactured by TOSOH CORPORATION
Column: Sample column; TSKguardcolumn Super HZ-H (one column) and TSKgel Super HZM-H (two columns), manufactured by TOSOH CORPORATION
Reference column; TSKgel Super H-RC (one column), manufactured by TOSOH CORPORATION
Flow rate: 0.6 mL/min
Injection amount: 10 μL
Column temperature: 40° C.
Eluent: THF
Concentration of injected sample: 0.2 weight %
Detector: differential refractometer The weight average molecular weight was calculated in terms of polystyrene.

<Observation of Surface State of Pressure-Sensitive Adhesive Layer>

Figure 13:
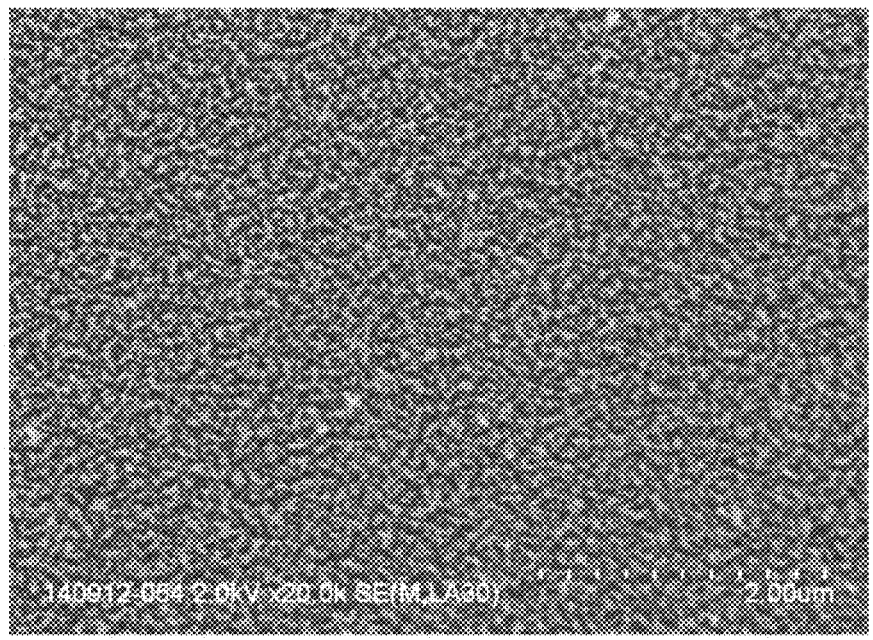
FIG. 13 is a 20000×SEM photograph presenting a surface state of a refractive index adjustment zone of a pressure-sensitive adhesive layer produced in one Inventive Example.

In each Inventive Example, the surface of the pressure-sensitive adhesive layer having the high refractive index material particles was observed using a field emission scanning electron microscope (FE-SEM) at an acceleration voltage of 2 kV, and at respective magnifications: 500 times, 2,000 times, 5,000 times and 20,000 times. A SEM photograph at a magnification of 20,000 times is presented in FIG. 13. The SEM photograph shows that the high refractive index material particles are uniformly dispersed.

<Observation of Gradation-Processed Microstructure>

Figure 14A:
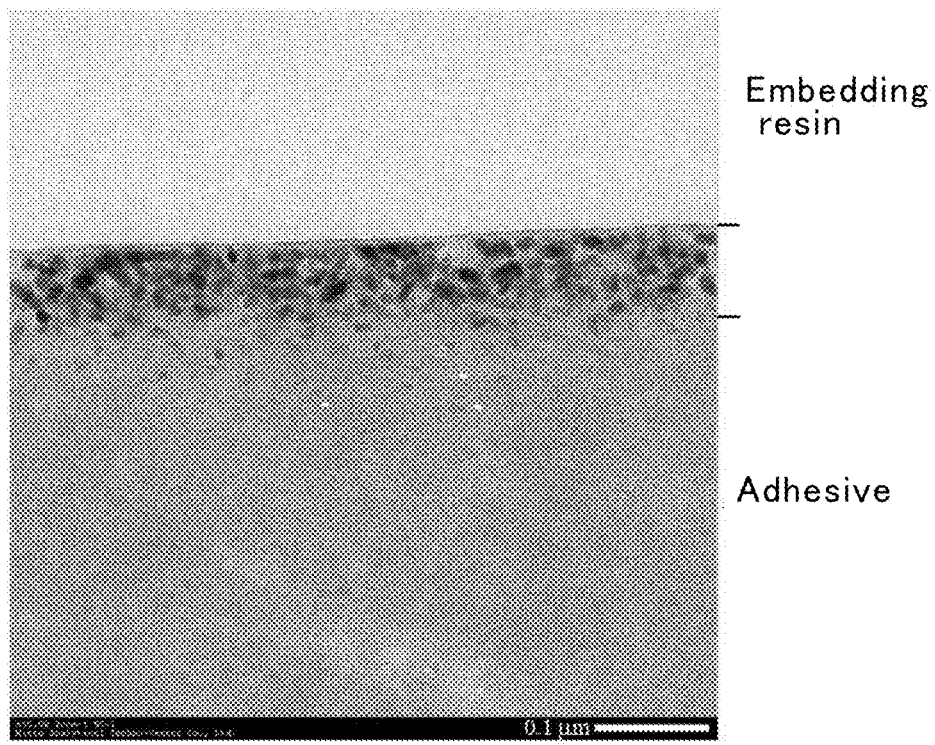
FIG. 14(a) is a 30000×TEM cross-sectional photographs presenting a high refractive index material particle distribution in a refractive index adjustment zone of a pressure-sensitive adhesive layer obtained in one Inventive Example.
Figure 14B:
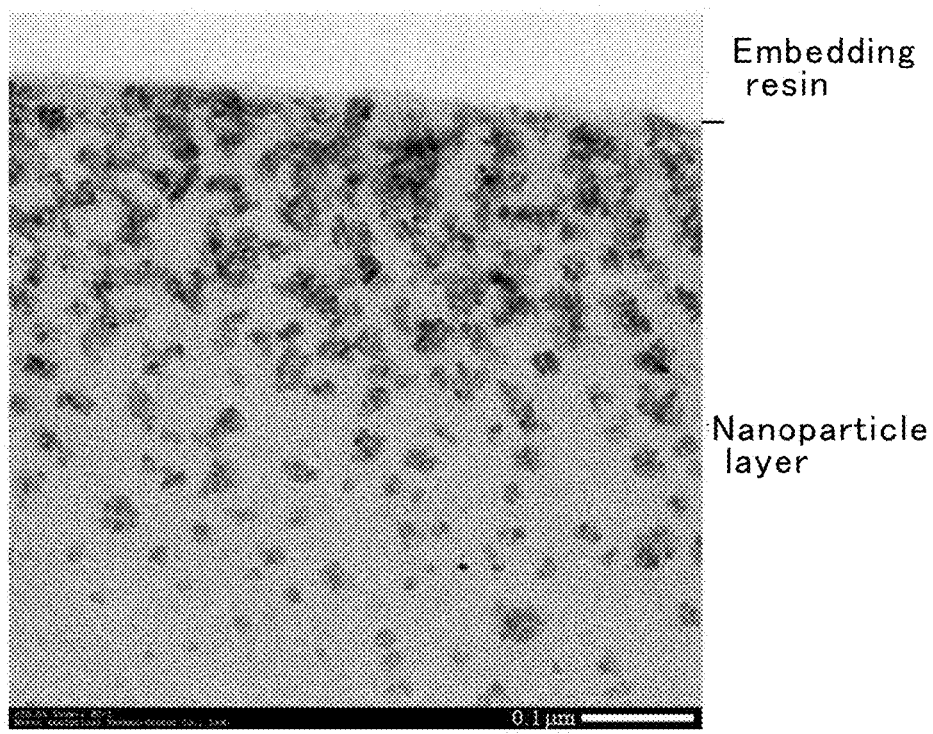
FIG. 14(b) is a 30000×TEM cross-sectional photographs presenting a high refractive index material particle distribution in a refractive index adjustment zone of a pressure-sensitive adhesive layer obtained in another Inventive Example.

In two Inventive Examples, a cross-section adjacent to the surface of the pressure-sensitive adhesive layer having the high refractive index material particles was observed using a transmission electron microscope (TEM) at a magnification of 30,000 times. Results of the observation are presented in FIGS. 14 (a) and 14(b). FIG. 14(a) shows that the high refractive index material particles are approximately uniformly distributed over approximately the entire thickness of the refractive index adjustment zone, whereas FIG. 14(b) shows that a distribution density of the high refractive index material particles in the pressure-sensitive adhesive layer is maximized at one surface of the pressure-sensitive adhesive layer, and gradually reduced toward the other surface in a thickness direction of the pressure-sensitive adhesive layer.

<Average Interfacial Refractive Index>

An average interfacial refractive index of the pressure-sensitive adhesive layers obtained in Inventive and Comparative Examples was calculated by measuring refractive indexes in the sodium D-lines (589 nm) using a spectroscopic ellipsometer ("EC-400" manufactured by JA. Woolam Co.). In each of the pressure-sensitive adhesive layers of Inventive and Comparative Examples, the separator sheets on the opposite surfaces of the pressure-sensitive adhesive layer were peeled off, and a black plate was laminated to a non-particle infiltration-side one of the surfaces. In this state, an average interfacial refractive index of the other surface, i.e., the particle infiltration-side surface, was measured. On the other hand, in each of the matrix material-based pressure-sensitive adhesive layers of Comparative Examples, two separator sheets on respective opposite surfaces of the pressure-sensitive adhesive layer were peeled off, and then a black plate was laminated to one of the surfaces. In this state, an average interfacial refractive index of the other surface of the pressure-sensitive adhesive layer was measured.

<Measurement of Thickness of Refractive Index Adjustment Zone>

A cross-section of the pressure-sensitive adhesive layer in a depth direction was adjusted to perform TEM observation. Based on the resulting TEM image (direct magnification: 3,000 to 30,000 times), a thickness of the refractive index adjustment zone was measured. The thickness of the refractive index adjustment zone was determined as an average value of undulation of the interface between the base adhesive zone and the refractive index adjustment zone. In a situation where it was difficult to identify the interface between the base adhesive zone and the refractive index adjustment zone, an interfacial TEM image was subjected to binary image processing using image processing software (ImageJ), and a depth in a region where 90% of the nanoparticles exists was determined as the thickness of the refractive index adjustment zone.

<Area Ratio of High Refractive Index Material Particles>

The particle infiltration-side surface of the pressure-sensitive adhesive layer was observed using FE-SEM at an acceleration voltage of 2 kV, and at respective magnifications: 500 times, 2,000 times and 5,000 times. The resulting interfacial TEM image was subjected to binary image processing using image processing software (ImageJ) to measure an area of the high refractive index material particles in a rectangular region having a long side length of 23 μm and a short side length of 18 μm so as to calculate an area ratio (%) of the high refractive index material particles to the entire rectangular region.

<Total Light Transmittance & Haze Value>

In each of the pressure-sensitive adhesive sheets obtained in Inventive and Comparative Examples, a particle infiltration-side one of the separator sheets was peeled off, and the resulting exposed surface was attached to a glass slide (trade name: "ShiroKenma No. 1", manufactured by Matsunami Glass Ind., Ltd., thickness: 0.8 to 1.0 mm, total light transmittance: 92%, haze: 0.2%). Then, the other separator sheet was further peeled off to produce a test piece having a three-layer structure of a layer of the base adhesive zone, a layer of the refractive index adjustment zone and a layer of the glass slide. On the other hand, in each of the pressure-sensitive adhesive sheets obtained in Comparative Examples, one of the separator sheets was peeled off, and the resulting exposed surface was attached to a glass slide (trade name: "ShiroKenma No. 1", manufactured by Matsunami Glass Ind., Ltd., thickness: 0.8 to 1.0 mm, total light transmittance: 92%, haze: 0.2%). Then, the other separator sheet was further peeled off to prepare a test piece having a two-layer structure of a layer of the base pressure-sensitive adhesive material and a layer of the glass slide. For each of the test pieces, a total light transmittance and a haze value in a visual light range was measured using a haze meter (device name: HM-150, manufactured by Murakami Color Research Laboratory Co., Ltd).

<Adhesive Force During 180-Degree Peeling (Adhesive Force with Respect to Glass Plate During 180-Degree Peeling>

A sheet piece having a length of 100 mm and a width of 25 mm was cut from each of the sheets obtained in Inventive and Comparative Examples. Then, in each of the sheet pieces of Inventive and Comparative Examples, a non-particle infiltration-side one of the separator sheets was peeled off, and a PET film (trade name: "LUMIRROR S-10", manufactured by TORAY Industries Inc., thickness: 25 μm) was attached (lined) to the exposed surface. On the other hand, in each of the sheet pieces of Comparative Examples 1 and 2, one of the separator sheets was peeled off, and a PET film (trade name: "LUMIRROR S-10", manufactured by TORAY Industries Inc., thickness: 25 μm) was attached (lined) to the exposed surface. Then, the other separator sheet was peeled off, and then the sheet piece was press-bonded to a glass plate (trade name: "Soda-Lime Glass #0050", manufactured by Matsunami Glass Ind., Ltd.) as a test plate, under press-bonding conditions: 2 kg roller; and one stroke, to produced a sample having a three-layer structure of a layer of the test plate, a layer of the base pressure-sensitive adhesive material and a layer of the PET film.

Each of the obtained samples was subjected to an autoclave treatment (50° C., 0.5 MPa, 15 minutes), and then subjected to cooling in an atmosphere at 23° C. and 50% R.H., for 30 minutes. After the cooling, the pressure-sensitive adhesive sheet (the pressure-sensitive adhesive layer and the PET film) was peeled off from the test plate to measure an adhesive force (N/25 mm) during 180-degree peeling, using a tension tester (device name: Autograph, manufactured by Shimadzu Corp.) according to JIS Z0237, in an atmosphere at 23° C. and 50% R.H., under conditions: tension rate=300 mm/minute; and peeling angle=180 degrees. Further, in each of Inventive and Comparative Examples, a matrix material-based pressure-sensitive adhesive sheet before the infiltration of the high refractive index material particles was prepared, and an adhesive force during 180-degree peeling was measured in the same manner as above.

<Transmittance of High Refractive Index Particle-Containing Dispersion Liquid>

A transmittance of the high refractive index particle-containing dispersion liquid was measured by a photoelectrometer (AC-114 manufactured by Optima Inc.) using a 530 nm filter. On the assumption that a transmittance of the dispersion medium itself is 100%, a transmittance (%) of each of the dispersion liquids used in Inventive and Comparative Examples was calculated.

<Measurement of Reflection Suppression Rate and Reflected Color Improvement Rate>

One of the opposite surfaces of each of the polarizing film laminates in Inventive and Comparative Examples was defined as a reflectance measuring surface, and a black acrylic plate (trade name: "CLAREX", manufactured by Nitto Jushi Kogyo Co., Ltd.) was attached to the other surface to produce a sample for reflectance measurement. As for samples of Inventive Example 4 and Comparative Example 4, the PET separator sheets on the pressure-sensitive adhesive layer were peeled off, and then a reflectance (Y value) of each of the optical element laminates on the side of the reflectance measuring surface was measured by a reflection spectrophotometer (U4100, manufactured by Hitachi High-Technologies Corp.). The measurement was performed at respective positions corresponding to an etched area and a non-etched area of the transparent electroconductive layer. That is, in the etched area (opening) of the transparent electroconductive layer, a reflectance at an interface between the refractive index adjustment zone of the pressure-sensitive adhesive layer and the element substrate of the polarizing film laminate is measured. Further, in the non-etched area (patterned portion) of the transparent electroconductive layer, a reflectance at an interface between the refractive index adjustment zone of the pressure-sensitive adhesive layer and the transparent electroconductive layer is measured. This is also applied to reflected color.

For the non-etched area, a reflection suppression rate was calculated based on the following formula. In the following formula, "reflectance (%) in case devoid of the particles" means a reflectance of each of the optical element laminates in Comparative Examples (using no particle). That is, the reflection suppression rate is an index indicating how much the reflectance can be reduced by providing the refractive index adjustment zone.

Reflection suppression rate(%)=reflectance(%)−reflectance(%) in case devoid of the particles A reflected color improvement rate was measured for each of the etched area and the non-etched area by deriving a difference in color value (ΔL*, Δa*, Δb*), and calculating a color-difference value (ΔE*ab) based on the following formula:

Color-difference value(ΔE*ab)=[(ΔL*)^2+(Δa*)^2+(Δb*)^2]^(½)

That is, the color-difference value (ΔE*ab) is an index indicating a difference in color between the etched area and the non-etched area.

<Determination on Pattern Invisibility>

Evaluation on pattern invisibility was determined based on a difference in reflected color between a portion of the electroconductive layer and a portion devoid of the electroconductive layer. When the color difference in reflected color was less than 1.0, the polarizing film laminate was evaluated as ⊚, and when the color difference in reflected color was from 1.0 to less than 2.0, the polarizing film laminate was evaluated as ○. Further, when the color difference in reflected color was equal to or greater than 2.0, the polarizing film laminate was evaluated as ×.

Configurations of the polarizing film laminates in Inventive Examples 1 to 8 and Comparative Examples 1 to 8 are presented in Table 3. Further, results of the evaluations in Inventive Examples 1 to 8 and Comparative Examples 1 to 8 are presented in Table 4.

TABLE 3

| | Polarizing Film Laminate | Pressure-senitive adhesive (outside) Type | Thickness | Polarizing Film | Pressure-Sensitive Adhesive (for laminating sensor) Type | Thickness | Electroconductive Layer-Laminated Base Film (patterned) |
|---|---|---|---|---|---|---|---|
| Inventive Example 1 | Polarizing film laminate (A) | — | — | Polarizing film (1) | Pressure-sensitive adhesive (1) | 23 | (1)zero retardation |
| Inventive Example 2 | Polarizing film laminate (B) | — | — | Polarizing film (2) | Pressure-sensitive adhesive (2) | 23 | (2)λ/4 base film |
| Inventive Example 3 | Polarizing film laminate (C) | — | — | Polarizing film (3) | Pressure-sensitive adhesive (2) | 23 | (2)λ/4 base film |
| Inventive Example 4 | Polarizing film laminate (D) | Pressure-sensitive adhesive (D) | 100 | Polarizing film (4) | Pressure-sensitive adhesive (3) | 23 | (2)λ/4 base film |
| Comparative Example 1 | Polarizing film laminate (E) | — | — | Polarizing film (1) | Pressure-sensitive adhesive A | 23 | (1)zero retardation |
| Comparative Example 2 | Polarizing film laminate (F) | — | — | Polarizing film (2) | Pressure-sensitive adhesive B | 23 | (2)λ/4 base film |
| Comparative Example 3 | Polarizing film laminate (G) | — | — | Polarizing film (3) | Pressure-sensitive adhesive B | 23 | (2)λ/4 base film |
| Comparative Example 4 | Polarizing film laminate (H) | Pressure-sensitive adhesive (D) | 100 | Polarizing film (4) | Pressure-sensitive adhesive C | 23 | (2)λ/4 base film |

TABLE 4

| | Electroconductive Layer Area | | | | | Non-Electroconductive Layer Area | | | | | |
|---|---|---|---|---|---|---|---|---|---|---|---|
| | Reflectance (Y %) | Reflected color | | | Electroconductive layer area's reflectance improvement effect | Reflectance (Y %) | Reflected color | | | Color difference with resect to electroconductive layer area (ΔE*ab) | Pattern Invisibility |
| | | L* | a* | b* | | | L* | a* | b* | | |
| Inventive Example 1 | 4.1 | 24.1 | 0.3 | −1.6 | −0.3 | 4.1 | 23.9 | 0.0 | −0.7 | 0.9 | ○ |
| Inventive Example 2 | 1.4 | 11.7 | 2.6 | −2.0 | −0.3 | 1.3 | 11.6 | 2.9 | −2.8 | 0.9 | ○ |
| Inventive Example 3 | 4.1 | 23.9 | 0.1 | −1.0 | −0.3 | 4.0 | 23.8 | 0.2 | −1.4 | 0.4 | ⊚ |
| Inventive Example 4 | 4.0 | 23.8 | 0.1 | −0.8 | −0.4 | 4.0 | 23.8 | 0.2 | −1.3 | 0.5 | ⊚ |
| Comparative Example 1 | 4.4 | 24.9 | 0.4 | −1.8 | — | 4.3 | 24.7 | −0.1 | 0.3 | 2.1 | X |
| Comparative Example 2 | 1.7 | 13.9 | 2.8 | −2.9 | — | 1.6 | 13.2 | 2.0 | 0.6 | 3.6 | X |
| Comparative Example 3 | 4.4 | 24.9 | 0.4 | −1.5 | — | 4.3 | 14.6 | −0.1 | 0.4 | 2.0 | X |
| Comparative Example 4 | 4.4 | 25.0 | 0.4 | −1.5 | — | 4.3 | 24.6 | −0.1 | 0.4 | 2.0 | X |

Comparing the evaluation results of Examples 1 to 8 with the evaluation results of Comparative Examples 1 to 8, it can be understood that the use of the refractive index adjustment zone-formed pressure-sensitive adhesive layer makes it possible to lower the reflectance by 0.3% to 0.4%. In addition, the use of the refractive index adjustment zone-formed pressure-sensitive adhesive layer makes it possible to improve the color difference with respect to the electrode portion to the range of 0.4 to 0.9. Furthermore, the use of the refractive index adjustment zone-formed pressure-sensitive adhesive layer makes it possible to improve the problem "poor pattern invisibility".

INDUSTRIAL APPLICABILITY

As mentioned above, in the present invention, in the pressure-sensitive adhesive layer for bonding a first optical element to a second optical element, the refractive index adjustment zone having a refractive index greater than a refractive index of the base pressure-sensitive adhesive material is formed over a given range from a surface of the pressure-sensitive adhesive layer on the side of the second optical element, in the thickness direction of the pressure-sensitive adhesive layer, so that it becomes possible to suppress the situation where internal reflections of external light are returned through the first optical element. The present invention can be applied to an optical display device, such as a liquid crystal display device and an organic EL display device. In particular, the present invention can be advantageously applied to a touch panel type display device having a touch sensor.

LIST OF REFERENCE SIGNS

S: pressure-sensitive adhesive sheet
S1, S2: support (backing)
1: optical element laminate
2: first optical element
3, 13: transparent pressure-sensitive adhesive layer
3a, 13a: base adhesive zone
3b, 13b: refractive index adjustment zone
4: second optical element
7: transparent electroconductive layer
17: high refractive index material particles
19: dispersion liquid
20: matrix material-based pressure-sensitive adhesive layer
21, 31: sub-laminate
22: COP element substrate
23: refractive index adjustment layer
24: ITO layer
25: pressure-sensitive adhesive layer
26: glass window
40: polarizing film laminate
41: polarizer
42: element substrate layer
43: transparent electroconductive layer
45: liquid crystal panel
46: liquid crystal cell
47: surface protective film
50: polarizing film laminate
51: polarizer
52: element substrate layer
53: transparent electroconductive layer
55: liquid crystal panel
56: liquid crystal cell
57: surface protective film
60: polarizing film laminate
61: polarizer
62: element substrate layer
63: transparent electroconductive layer
64: pressure-sensitive adhesive layer
65: organic EL panel
66: organic EL cell
67: surface protective film
70: organic EL panel
71: organic EL cell
72: pressure-sensitive adhesive layer
73: element substrate layer
74: transparent electroconductive layer
75: polarizer
76: ¼ wavelength retardation film
77: low reflective index layer
78: pressure-sensitive adhesive layer
79: surface protective film

The invention claimed is:

1. A polarizing film laminate comprising:
an element substrate;
a polarizer formed on the element substrate;
a transparent electroconductive layer formed on one surface of the element substrate on a side opposite to the polarizer and patterned so as to function as a touch sensor by itself or in cooperation with an additional component; and
a pressure-sensitive adhesive layer attached onto the transparent electroconductive layer,
wherein the transparent electroconductive layer and the pressure-sensitive adhesive layer are both formed on the surface of the element substrate on the side opposite to the polarizer,
wherein the pressure-sensitive adhesive layer comprises:
a base pressure-sensitive adhesive material zone made of a transparent base pressure-sensitive adhesive material and formed over a given range from one principal surface of the pressure-sensitive adhesive layer in a thickness direction of the pressure-sensitive adhesive layer; and
a refractive index adjustment zone formed over a given range from the other principal surface of the pressure-sensitive adhesive layer in the thickness direction, the refractive index adjustment zone comprising the transparent base pressure-sensitive adhesive material and a different material infiltrated into the transparent base pressure-sensitive adhesive material, the refractive index adjustment zone having an average refractive index greater than a refractive index of the transparent base pressure-sensitive adhesive material,
wherein
the refractive index adjustment zone of the pressure-sensitive adhesive layer is between the base pressure-sensitive adhesive material zone and the element substrate,
the refractive index of the refractive index adjustment zone is different from at least one of a refractive index of the transparent electroconductive layer or a refractive index of the element substrate,
the base pressure-sensitive adhesive material zone is free from including the different material included in the refractive index adjustment zone, and
a boundary between the base pressure-sensitive adhesive material zone and the refractive index adjustment zone has differing depths with respect to at least one of the principal surfaces of the pressure-sensitive adhesive layer in the thickness direction of the pressure-sensitive adhesive layer based on a plurality of measurement positions along the boundary.

2. The polarizing film laminate as recited in claim 1, wherein the refractive index adjustment zone has a thickness of 20 nm to 600 nm.

3. The polarizing film laminate as recited in claim 1, wherein the different material comprises particles of a high refractive index material having a refractive index greater than that of the transparent base pressure-sensitive adhesive material.

4. The polarizing film laminate as recited in claim 3, wherein the refractive index of the high refractive index material is in the range of 1.60 to 2.74.

5. The polarizing film laminate as recited in claim 3, wherein the particles of the high refractive index material are partially exposed with respect to the element substrate and a matrix region comprising the transparent base pressure-sensitive adhesive material included in the refractive index adjustment zone is partially exposed with respect to the element substrate.

6. The polarizing film laminate as recited in claim 3, wherein the particles of the high refractive index material have an average primary particle size of 3 to 100 nm as measured by TEM observation.

7. The polarizing film laminate as recited in claim 3, wherein a difference between the refractive index of the particles of the high refractive index material and the refractive index of the transparent base pressure-sensitive adhesive material is in the range of 0.15 to 1.34.

8. The polarizing film laminate as recited in claim 3, wherein the high refractive index material is one or more compounds selected from the group consisting of $TiO_2$, $ZrO_2$, $CeO_2$, $Al_2O_3$, $BaTiO_3$, $Nb_2O_5$ and $SnO_2$.

9. The polarizing film laminate as recited in claim 1, wherein the different material comprises an organic material having a refractive index greater than that of the transparent base pressure-sensitive adhesive material, the different material being added to the transparent base pressure adhesive material included in the refractive index adjustment zone in the form of a particle, a polymer or an oligomer, to thereby increase the average refractive index of the refractive index adjustment zone compared to the base pressure-sensitive adhesive material zone.

10. The polarizing film laminate as recited in claim 9, wherein the refractive index of the transparent base pressure-sensitive adhesive material is in the range of 1.40 to 1.55, and the refractive index of the organic material is in the range of 1.59 to 2.04.

11. The polarizing film laminate as recited in claim 1, wherein the pressure-sensitive adhesive layer has a total light transmittance of 80% or more.

12. The polarizing film laminate as recited in claim 3, wherein the particles of the high refractive index material partially exist in the form of an aggregate arising from aggregation of two or more thereof.

13. The polarizing film laminate as recited in claim 1, wherein the refractive index of the refractive index adjustment zone is less than the refractive index of the transparent electroconductive layer.

14. The polarizing film laminate as recited in claim 1, wherein the refractive index of the refractive index adjustment zone is greater than the refractive index of the element substrate.

15. The polarizing film laminate as recited in claim 1, wherein the transparent electroconductive layer is made of indium tin oxide, and wherein the refractive index of the transparent base pressure-sensitive adhesive material is in the range of 1.40 to 1.55, and the refractive index of the refractive index adjustment zone is in the range of 1.50 to 1.80.

16. The polarizing film laminate as recited in claim 1, wherein the element substrate is a zero retardation film.

17. A liquid crystal panel comprising:
the polarizing film laminate as recited in claim 16;
a protective film located on the side of the polarizer of the polarizing film laminate; and
a liquid crystal cell located on the side of the pressure-sensitive adhesive layer of the polarizing film laminate.

18. The polarizing film laminate as recited in claim 1, wherein the element substrate is a retardation film.

19. The polarizing film laminate as recited in claim 18, wherein the retardation film has a glass transition temperature of 160 degrees or more.

20. A liquid crystal panel comprising:
the polarizing film laminate as recited in claim 18;
a protective film located on the side of the polarizer of the polarizing film laminate; and
a liquid crystal cell located on the side of the pressure-sensitive adhesive layer of the polarizing film laminate.

21. A polarizing film laminate comprising:
an element substrate;
a transparent electroconductive layer formed on one surface of the element substrate and patterned so as to function as a touch sensor by itself or in cooperation with an additional component;
a first pressure-sensitive adhesive layer attached onto the one surface of the element substrate and the transparent electroconductive layer;
a polarizer located on one surface of the first pressure-sensitive adhesive layer on a side opposite to the element substrate; and
a second pressure-sensitive adhesive layer attached to the other surface of the element substrate on a side opposite to the transparent electroconductive layer,
wherein the first pressure-sensitive adhesive layer comprises:
a base pressure-sensitive adhesive material zone made of a transparent base pressure-sensitive adhesive material and formed over a given range from one principal surface of the first pressure-sensitive adhesive layer in a thickness direction of the first pressure-sensitive adhesive layer; and
a refractive index adjustment zone formed over a given range from the other principal surface of the first pressure-sensitive adhesive layer in the thickness direction, the refractive index adjustment zone comprising the transparent base pressure-sensitive adhesive material and a different material infiltrated into the transparent base pressure-sensitive adhesive material, the refractive index adjustment zone having an average refractive index greater than a refractive index of the transparent base pressure-sensitive adhesive material,
wherein
the base pressure-sensitive adhesive material zone of the first pressure-sensitive adhesive layer is between the refractive index adjustment zone and the polarizer,
the refractive index of the refractive index adjustment zone is different from at least one of a refractive index of the transparent electroconductive layer or a refractive index of the element substrate, the base pressure-sensitive adhesive material zone is free from including the different material included in the refractive index adjustment zone, and a boundary between the base pressure-sensitive adhesive material zone and the refractive index adjustment zone has differing depths with respect to at least one of the principal surfaces of the pressure-sensitive adhesive layer in the thickness direction of the pressure-sensitive adhesive layer based on a plurality of measurement positions along the boundary.

22. The polarizing film laminate as recited in claim 21, wherein the refractive index adjustment zone has a thickness of 20 nm to 600 nm.

23. The polarizing film laminate as recited in claim 21, wherein the refractive index adjustment zone is formed by dispersing particles of a high refractive index material having a refractive index greater than that of the transparent base pressure-sensitive adhesive material, to thereby increase the average refractive index of the refractive index adjustment zone.

24. The polarizing film laminate as recited in claim 23, wherein the refractive index of the high refractive index material is in the range of 1.60 to 2.74.

25. The polarizing film laminate as recited in claim 23, wherein the particles of the high refractive index material are partially exposed with respect to the element substrate and a matrix region comprising the transparent base pressure-sensitive adhesive material included in the refractive index adjustment zone is partially exposed with respect to the element substrate.

26. The polarizing film laminate as recited in claim 23, wherein the particles of the high refractive index material have an average primary particle size of 3 to 100 nm as measured by TEM observation.

27. The polarizing film laminate as recited in claim 23, wherein a difference between the refractive index of the particles of the high refractive index material and the refractive index of the transparent base pressure-sensitive adhesive material is in the range of 0.15 to 1.34.

28. The polarizing film laminate as recited in claim 23, wherein the high refractive index material is one or more compounds selected from the group consisting of $TiO_2$, $ZrO_2$, $CeO_2$, $Al_2O_3$, $BaTiO_3$, $Nb_2O_5$ and $SnO_2$.

29. The polarizing film laminate as recited in claim 23, wherein the particles of the high refractive index material partially exist in the form of an aggregate arising from aggregation of two or more thereof.

30. The polarizing film laminate as recited in claim 21, wherein the different material comprises an organic material having a refractive index greater than that of the transparent base pressure-sensitive adhesive material, the different material being added to the transparent base pressure adhesive material included in the refractive index adjustment zone in the form of a particle, a polymer or an oligomer, to thereby increase the average refractive index of the refractive index adjustment zone compared to the base pressure-sensitive adhesive material zone.

31. The polarizing film laminate as recited in claim 30, wherein the refractive index of the transparent base pressure-sensitive adhesive material is in the range of 1.40 to 1.55, and the refractive index of the organic material is in the range of 1.59 to 2.04.

32. The polarizing film laminate as recited in claim 21, wherein the first pressure-sensitive adhesive layer has a total light transmittance of 80% or more.

33. The polarizing film laminate as recited in claim 21, wherein the refractive index of the refractive index adjustment zone is less than the refractive index of the transparent electroconductive layer.

34. The polarizing film laminate as recited in claim 21, wherein the refractive index of the refractive index adjustment zone is greater than the refractive index of the element substrate.

35. The polarizing film laminate as recited in claim 21, wherein the element substrate is a ¼-wavelength retardation film.

36. An organic EL panel comprising:
the polarizing film laminate as recited in claim 35;
a surface protective film located on the side of the polarizer of the polarizing film laminate; and
a liquid crystal cell located on the side of the second pressure-sensitive adhesive layer of the polarizing film laminate.

37. The organic EL panel as recited in claim 36, further comprising:
a ¼-wavelength retardation film attached to one surface of the polarizer on a side opposite to the first pressure-sensitive adhesive layer;
a low-refractive index layer attached to one surface of the ¼-wavelength retardation film attached to the polarizer, on a side opposite to the polarizer; and
a third pressure-sensitive adhesive layer attached to one surface of the low-refractive index layer on a side opposite to the ¼-wavelength retardation film attached to the polarizer, wherein the surface protective layer is attached to one surface of the third pressure-sensitive adhesive layer on a side opposite to the low-refractive index layer.

* * * * *